United States Patent
Kim et al.

(10) Patent No.: US 8,716,117 B2
(45) Date of Patent: May 6, 2014

(54) SEMICONDUCTOR DEVICE AND METHOD OF FORMING THE SAME

(75) Inventors: Myeongcheol Kim, Suwon-si (KR); Sooyeon Jeong, Bucheon-si (KR); Joon Goo Hong, Daegu (KR); Dohyoung Kim, Hwaseong-si (KR); Yongjin Kim, Suwon-si (KR); Jin Wook Lee, Seoul (KR); Yoonhae Kim, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 123 days.

(21) Appl. No.: 13/106,977

(22) Filed: May 13, 2011

(65) Prior Publication Data

US 2011/0281426 A1 Nov. 17, 2011

Related U.S. Application Data

(60) Provisional application No. 61/334,666, filed on May 14, 2010.

(30) Foreign Application Priority Data

May 14, 2010 (KR) .................. 10-2010-0045527

(51) Int. Cl.
*H01L 21/28* (2006.01)
(52) U.S. Cl.
USPC ............... 438/587; 438/299; 257/E21.626; 257/E21.64
(58) Field of Classification Search
USPC ......... 438/197, 199, 229, 586, 587, 595, 637, 438/640, 701, 230, 233, 299; 257/E21.626, 257/E21.627, E21.64, E21.641
See application file for complete search history.

(56) References Cited

U.S. PATENT DOCUMENTS

| | | | | |
|---|---|---|---|---|
| 6,207,514 B1 * | 3/2001 | Furukawa et al. | | 438/299 |
| 6,281,064 B1 * | 8/2001 | Mandelman et al. | | 438/233 |
| 6,383,878 B1 * | 5/2002 | Huang | | 438/299 |
| 6,440,867 B1 * | 8/2002 | Besser et al. | | 438/721 |
| 7,141,471 B2 * | 11/2006 | Yamada et al. | | 438/239 |
| 7,416,968 B2 * | 8/2008 | Kim et al. | | 438/592 |
| 7,488,659 B2 * | 2/2009 | Dyer | | 438/296 |
| 7,544,594 B2 * | 6/2009 | Change | | 438/585 |
| 7,808,058 B2 * | 10/2010 | Change | | 257/412 |
| 7,875,519 B2 * | 1/2011 | Rachmady et al. | | 438/299 |
| 8,563,412 B2 * | 10/2013 | Kim et al. | | 438/585 |
| 2006/0261041 A1 * | 11/2006 | Kwon et al. | | 216/89 |
| 2008/0230815 A1 * | 9/2008 | Ekbote et al. | | 257/288 |
| 2010/0112803 A1 * | 5/2010 | Lee et al. | | 438/637 |
| 2011/0062501 A1 * | 3/2011 | Soss et al. | | 257/288 |
| 2011/0156107 A1 * | 6/2011 | Bohr et al. | | 257/288 |

FOREIGN PATENT DOCUMENTS

| | | | | |
|---|---|---|---|---|
| JP | 2008-211027 | | 9/2008 | |
| KR | 2001-0004381 | | 1/2001 | |
| KR | 2001004381 A | * | 1/2001 | |
| KR | 20010004381 A | * | 11/2001 | ............. H01L 21/28 |
| KR | 10-0600287 | | 12/2005 | |

* cited by examiner

*Primary Examiner* — Mark Tornow
*Assistant Examiner* — Abbigale Boyle
(74) *Attorney, Agent, or Firm* — Onello & Mello, LLP

(57) ABSTRACT

A semiconductor device and a method of forming the semiconductor device includes: forming gate electrodes on a semiconductor substrate and forming spacers on both side surfaces of the gate electrodes; forming capping patterns on the gate electrodes; and forming a metal contact between the gate electrodes. Each of the capping patterns is formed to have a width greater than a width of each of the gate electrodes.

28 Claims, 19 Drawing Sheets

SEMICONDUCTOR DEVICE AND METHOD OF FORMING THE SAME

CROSS-REFERENCE TO RELATED APPLICATIONS

This application claims priority under 35 U.S.C. §119 to Korean Patent Application No. 10-2010-0045527 filed in the Korean Intellectual Property Office on May 14, 2010 and U.S. Provisional Application No. 61/334,666 filed in the U.S. Patent and Trademark Office on May 14, 2010, the entire contents of which applications are hereby incorporated by reference.

BACKGROUND

The present inventive concept herein relates to a semiconductor device and a method of forming the semiconductor device, and more particularly, to a semiconductor device having a metal contact and a method of forming the semiconductor device.

Semiconductor devices can be manufactured to very small sizes, can perform multiple functions and have relatively low manufacturing cost. As a result, semiconductor devices have become an extremely important element in the electronics industry. There are various types of semiconductor devices, such as memory devices which store logic data, logic devices which perform logical operations, and other such devices.

As logic devices are made smaller, i.e., miniaturized, demand for high integration is increasing. High integration of logic devices has many limitations and causes many limiting effects in the logic devices.

SUMMARY

The present inventive concept provides a semiconductor device with enhanced reliability and a method of forming the semiconductor device.

According to one aspect, the inventive concept is directed to a method of forming a semiconductor device including: forming gate electrodes on a semiconductor substrate and forming spacers on first and second side surfaces of the gate electrodes; forming capping patterns on the gate electrodes; and forming a metal contact between the gate electrodes. Each of the capping patterns is formed to have a width greater than a width of each of the gate electrodes.

In some embodiments, forming the gate electrodes and forming spacers comprise: forming dummy gate patterns on the semiconductor substrate; forming the spacers on side surfaces of the dummy gate patterns; and removing the dummy gate patterns to form a first opening. The gate electrodes are formed in the first opening.

In some embodiments, the above method may further include, prior to forming the gate electrodes, forming a gate insulating layer in the first opening.

In some embodiments, after the gate electrodes are formed, upper surfaces of the gate electrodes are exposed, and lower surfaces of the capping patterns contact the upper surfaces of the gate electrodes.

In some embodiments, a side surface of the capping pattern may be horizontally offset with respect to at least one of the first and second side surfaces of each of the gate electrodes.

In some embodiments, the capping patterns may be formed to cover the gate electrodes and at least some of the spacers.

In some embodiments, forming the capping patterns may include: forming a first insulating layer disposed between the spacers; forming a second insulating layer covering the first insulating layer and the gate electrodes; and forming first mask patterns having second openings on the second insulating layer. The first mask patterns may be formed with a width greater than the width of the gate electrodes.

In some embodiments, the width of each of the first mask patterns may be greater than or equal to a sum of the width of each of the gate electrodes and widths of the spacers on both side surfaces of each of the gate electrodes.

In some embodiments, forming the capping patterns may include forming second mask patterns on the first mask patterns, the second mask patterns having third openings, the third openings being greater in width than the second openings and exposing the second openings. The second openings may be formed in a line shape and the third openings may be formed in a hole or bar shape.

In some embodiments, forming the capping patterns may further include, after forming the first mask patterns, forming a third insulating layer filling the second opening.

In some embodiments, forming the capping patterns may further include etching the second insulating layer using the first and second mask patterns as a mask.

In some embodiments, etching the second insulating layer may include etching the first insulating layer and the third insulating layer.

In some embodiments, the method may further include, after etching the first, second and third insulating layers, removing the second mask patterns and forming a subsidiary insulating layer covering the first mask patterns, the capping patterns and the spacers.

In some embodiments, the method may further include etching some of the first mask patterns and the subsidiary insulating layer to expose an upper surface of the semiconductor substrate.

In some embodiments, the method may further include, prior to forming the first insulating layer, forming an etch stopper layer covering the spacers and the semiconductor substrate.

In some embodiments, exposing the semiconductor substrate may include etching the etch stopper layer covering the semiconductor substrate to form an etch stopper pattern on the spacers.

In some embodiments, the method may further include foaming a silicide layer on the exposed semiconductor substrate, wherein the metal contacts may be formed on the silicide layer.

In some embodiments, forming the metal contact may include forming a metal layer filling a space between the gate electrodes, and recessing some of the metal layer and the first mask patterns to expose the capping patterns.

In some embodiments, the gate electrode comprises at least one of a metal and a metal compound.

In some embodiments, the capping pattern comprises a silicon oxide layer.

In some embodiments, the gate electrode comprises at least one of aluminum, titanium nitride and tantalum nitride.

In some embodiments, forming the capping patterns may further include forming second mask patterns on the first mask patterns, the second mask patterns having third openings which are greater in width than the second openings and which expose the second openings. The second openings may be formed in a line shape and the third openings are formed in a hole or bar shape. The third openings may include an extending opening which exposes the second openings adjacent to each other at the same time.

In some embodiments, forming the capping patterns may include etching at least some of the first mask pattern exposed by the extending opening to form a recess pattern.

In some embodiments, forming the metal contacts may include forming a metal layer filling a space between the gate electrodes and etching some of the metal layer to expose at least one of the first mask patterns.

In some embodiments, the metal contacts may be connected to each other on the recess pattern.

According to another aspect, the inventive concept is directed to a method of forming a semiconductor device including: forming a dummy gate pattern on a semiconductor substrate; forming a spacer on a sidewall of the dummy gate pattern; forming an etch stopper layer covering the dummy gate pattern and the spacer; forming a first insulating layer on the etch stopper layer; performing a planarizing process for the first insulating layer and the etch stopper layer to expose an upper surface of the dummy gate pattern; removing the dummy gate pattern; forming gate electrodes on a region from which the dummy gate pattern is removed; forming capping patterns on the gate electrodes; and forming a metal contact between the gate electrodes. Each of the capping patterns is formed with a width which is greater than a width of the gate electrodes.

In some embodiments, the method may further include, prior to forming the dummy gate pattern on the semiconductor substrate, forming a sacrificial oxide layer on the semiconductor substrate.

In some embodiments, the above method may further include, after removing the dummy gate pattern, removing the sacrificial oxide layer such that the semiconductor substrate is exposed.

In some embodiments, the above method may further include, prior to forming the gate electrode, forming a gate insulating layer on the exposed semiconductor substrate.

According to another aspect, the inventive concept is directed to a semiconductor device, which includes gate electrodes on a semiconductor substrate; spacers on side surfaces of the gate electrodes; capping patterns on the gate electrodes; and a metal contact between the gate electrodes. A width of each of the capping patterns may be greater than a width of each of the gate electrodes.

In some embodiments, the semiconductor device may further include a gate insulating layer disposed between the semiconductor substrate and the gate electrodes.

In some embodiments, the capping patterns may cover upper surfaces of the gate electrodes and at least some of the spacers.

In some embodiments, the semiconductor device may further include etch stopper patterns covering the spacers and disposed between the spacers and the metal contact.

In some embodiments, the gate electrodes may include aluminum, titanium nitride and/or tantalum nitride.

In some embodiments, the capping patterns may include a silicon oxide layer.

In some embodiments, the above semiconductor device may further include a silicide layer between the semiconductor substrate and the metal contact.

In some embodiments, the semiconductor device may further include mask patterns on the capping patterns, wherein the mask patterns may extend in one direction to cover the capping patterns and have a width greater than the width of the capping patterns.

In some embodiments, an upper surface of the metal contact is at the same level as an upper surface of at least some of the mask patterns.

In some embodiments, the mask patterns may include a recess pattern having an upper surface which is lower than the upper surface of the metal contact.

In some embodiments, the metal contacts disposed at opposite sides of the recess pattern may be connected to each other on the recess pattern.

In some embodiments, the gate pattern may include an aluminum layer and an aluminum oxide layer on the aluminum layer.

In some embodiments, the spacers disposed on first side surfaces of the gate electrodes may have upper portions which are recessed.

According to another aspect, the inventive concept is directed to a method of forming a semiconductor device, comprising: forming a sacrificial oxide layer on a semiconductor substrate; forming a dummy gate pattern on the sacrificial oxide layer; forming a spacer on a sidewall of the dummy gate pattern; forming an etch stopper layer covering the dummy gate pattern and the spacer; forming a first insulating layer on the etch stopper layer; performing a planarizing process for the first insulating layer and the etch stopper layer to expose an upper surface of the dummy gate pattern; removing the dummy gate pattern; removing the sacrificial oxide layer such that the semiconductor substrate is exposed; forming a gate insulating layer on the exposed semiconductor substrate; forming gate electrodes on a region from which the dummy gate pattern is removed; forming capping patterns on the gate electrodes, wherein forming the capping patterns comprises: forming a second insulating layer disposed between the spacers; forming a third insulating layer covering the second insulating layer and the gate electrodes; and forming first mask patterns having second openings on the third insulating layer, wherein the first mask patterns are formed with a width greater than the width of the gate electrodes, such that each of the capping patterns is formed with a width which is greater than a width of the gate electrodes; and forming a metal contact between the gate electrodes.

In some embodiments, the width of each of the first mask patterns is greater than or equal to a sum of the width of each of the gate electrodes and widths of the spacers on both side surfaces of each of the gate electrodes.

In some embodiments, the method further comprises forming second mask patterns on the first mask patterns, the second mask patterns having third openings being greater in width than the second openings.

In some embodiments, the method further comprises forming a silicide layer on the exposed semiconductor substrate, wherein the metal contact is formed on the silicide layer.

In some embodiments, the gate electrode comprises at least one of a metal and a metal compound.

In some embodiments, the capping pattern comprises a silicon oxide layer.

In some embodiments, the gate electrode comprises at least one of aluminum, titanium nitride and tantalum nitride.

In some embodiments, forming the metal contact comprises forming a metal layer filling a space between the gate electrodes and etching some of the metal layer.

BRIEF DESCRIPTION OF THE DRAWINGS

The foregoing and other features and advantages of the invention will be apparent from the more particular description of preferred aspects of the invention, as illustrated in the accompanying drawings in which like reference characters refer to the same parts throughout the different views. The drawings are not necessarily to scale, emphasis instead being placed upon illustrating the principles of the invention. In the drawings, the thickness of layers and regions are exaggerated for clarity.

FIGS. 1A through 10B are schematic views illustrating a method of forming a semiconductor device according to an exemplary embodiment of the present inventive concept. Specifically, FIGS. 1A, 2A, 3A, 4A, 5A, 6A, 7A, 8A, 9A and 10A are schematic plan views illustrating a method of forming a semiconductor device according to an embodiment of the present inventive concept; and FIGS. 1B, 2B, 3B, 4B, 5B, 6B, 7B, 8B, 9B and 10B are schematic cross-sectional views taken along lines I-I', IV-IV', V-V', VI-VI', VII-VII', VIII-VIII', IX-IX' and X-X', respectively, of FIGS. 1A, 2A, 3A, 4A, 5A, 6A, 7A, 8A, 9A and 10A, respectively.

FIGS. 12A through 17B are schematic views illustrating a method of forming a semiconductor device according to another exemplary embodiment of the present inventive concept. Specifically, FIGS. 12A, 13A, 14A, 15A, 16A and 17A are schematic plan views illustrating a method of forming a semiconductor device according to another embodiment of the present inventive concept, and FIGS. 12B, 13B, 14B, 15B, 16B and 17B are schematic cross-sectional views taken along lines XI-XI', XII-XII', XIV-XIV', XV-XV' and XVI-XVI' of FIGS. 12A, 13A, 14A, 15A, 16A and 17A, respectively.

DETAILED DESCRIPTION OF THE EMBODIMENTS

Figure 1A:
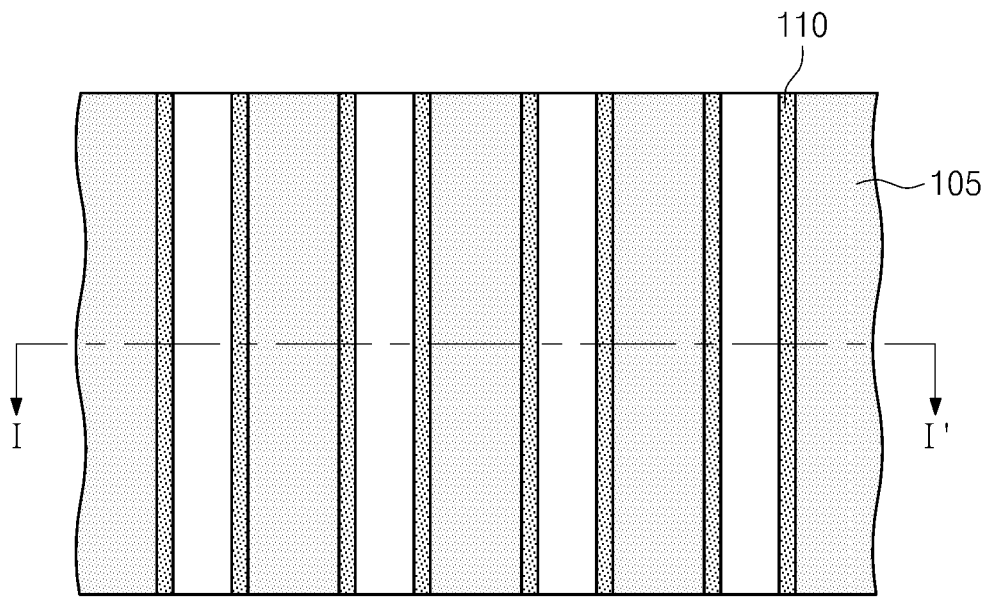

In the specification, it will be understood that when an element is referred to as being 'on' another element, it can be directly on the other element, or intervening elements may also be present. Also, in the figures, the dimensions of elements may be exaggerated for clarity of illustration. Like reference numerals refer to like elements throughout.

The embodiments will be described with reference to sectional views as ideal exemplary views of the present inventive concept. Also, in the figures, the dimensions of layers and regions may be exaggerated for clarity of illustration. Accordingly, shapes of the exemplary views may be modified according to manufacturing techniques and/or allowable errors. Therefore, the embodiments of the present inventive concept are not limited to the specific shapes illustrated in the exemplary views, but may include other shapes that may be created according to manufacturing processes. For example, an etched region shown at a right angle may be formed with a rounded corner or with a curvature. Accordingly, regions exemplified in the drawings have general properties and shapes of the regions are used to illustrate specific shapes of the regions constituting a device. Thus, this should not be construed as limiting the scope of the present inventive concept. Also, though terms like a first, a second, and a third are used to describe various elements in various embodiments of the present inventive concept, the elements are not limited to these terms. These terms are used only to discriminate one element from another element. Embodiments described and exemplified herein include complementary embodiments thereof.

The terminology used herein is for the purpose of describing particular example embodiments only and is not intended to be limiting. As used herein, the singular forms "a", "an" and "the" may be intended to include the plural forms as well, unless the context clearly indicates otherwise. It will be further understood that the terms "comprises" and/or "comprising" when used in this specification, do not preclude the presence or addition of one or more other elements.

FIGS. 1A through 10B are schematic views illustrating a method of forming a semiconductor device according to an exemplary embodiment of the present inventive concept. Specifically, FIGS. 1A, 2A, 3A, 4A, 5A, 6A, 7A, 8A, 9A and 10A are schematic plan views illustrating a method of forming a semiconductor device according to an embodiment of the present inventive concept; and FIGS. 1B, 2B, 3B, 4B, 5B, 6B, 7B, 8B, 9B and 10B are schematic cross-sectional views taken along lines I-I', II-II', III-III', IV-IV', V-V', VI-VI', VII-VII', VIII-VIII', IX-IX' and X-X', respectively, of FIGS. 1A, 2A, 3A, 4A, 5A, 6A, 7A, 8A, 9A and 10A, respectively.

Figure 1B:
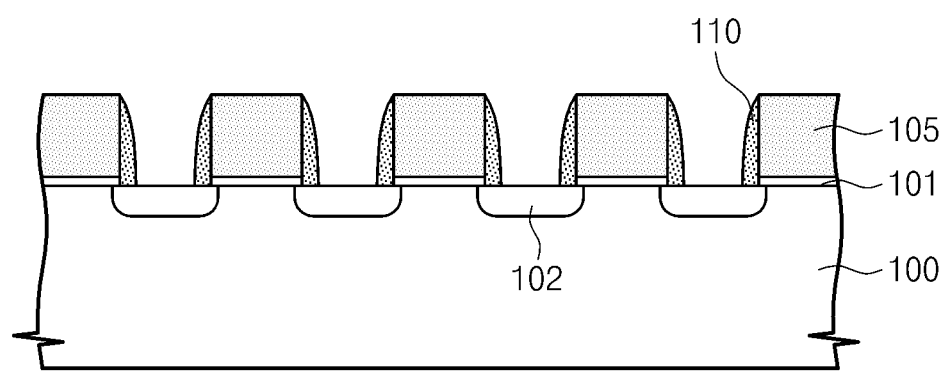

Referring to FIGS. 1A and 1B, a sacrificial oxide layer 101 is formed on a semiconductor substrate 100. In some exemplary embodiments, the sacrificial oxide layer 101 may be formed of, for example, a silicon oxide layer. The sacrificial oxide layer 101 may be formed by using, for example, a thermal oxidation process or a chemical vapor deposition process. Dummy gate patterns 105 are formed on the sacrificial oxide layer 101. In some exemplary embodiments, the dummy gate patterns 105 may be formed of, for example, polysilicon. Spacers 110 are formed on sidewalls of the dummy gate patterns 105. In some exemplary embodiments, the spacers 110 may be formed of, for example, a silicon nitride layer. After the dummy gate patterns 105 are formed, one or more source/drain regions 102 may be formed. In some exemplary embodiments, the source/drain region 102 may include a lightly doped source/drain region and a heavily doped source/drain region. According to an exemplary embodiment of the present inventive concept, after the source/drain region 102 is formed, gate electrodes to be described below may be formed. In some exemplary embodiments, the gate electrodes are formed after the source/drain region 102 because the diffusion temperature for forming the source/drain region 102 is higher than the melting temperature of a metal material used in forming the gate electrodes. Therefore, forming the source/drain regions 102 after forming the gate electrodes would result in undesired melting of the gate electrodes.

Figure 2A:
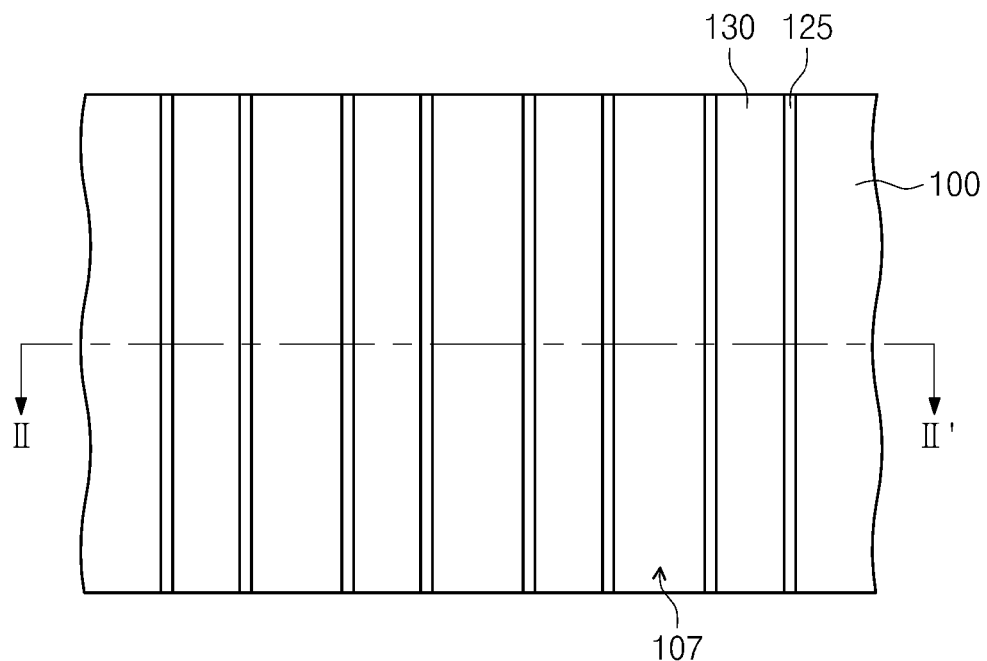
Figure 2B:
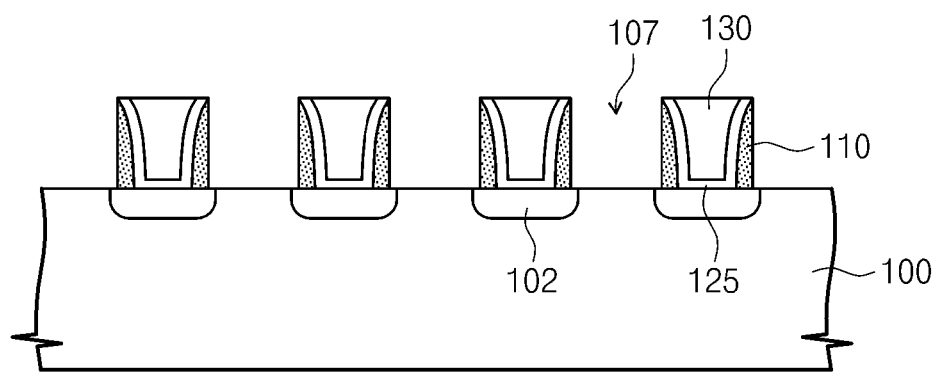

Referring to FIGS. 2A and 2B, an etch stopper layer 125 covering the spacers 110 and the semiconductor substrate 100 is formed. In some exemplary embodiments, the etch stopper layer 125 may be formed of for example, a silicon nitride layer. A first insulating layer 130 filling spaces between the spacers 110 is formed. In some exemplary embodiments, the first insulating layer 130 may be formed of, for example, a silicon oxide layer. The etch stopper layer 125 may be formed by forming a preliminary etch stopper layer (not shown) covering the dummy gate patterns 105 and the spacers 110, forming an insulating layer (not shown) covering the preliminary etch stopper layer 125 and performing a planarizing process to expose upper surfaces of the dummy gate patterns 105. The insulating layer may be etched by the planarizing process to form the first insulating layer 130. One or more first openings 107 may be formed by removing the sacrificial layer 101 and the dummy gate patterns 105. The semiconductor substrate 100 may be exposed by removing the sacrificial oxide layer 101 and the dummy gate patterns 105.

Figure 3A:
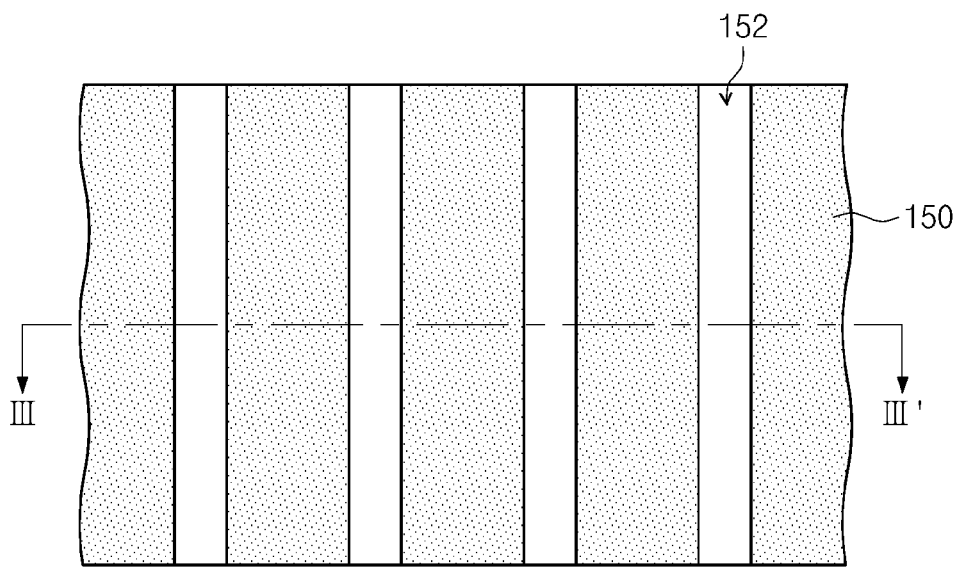
Figure 3B:
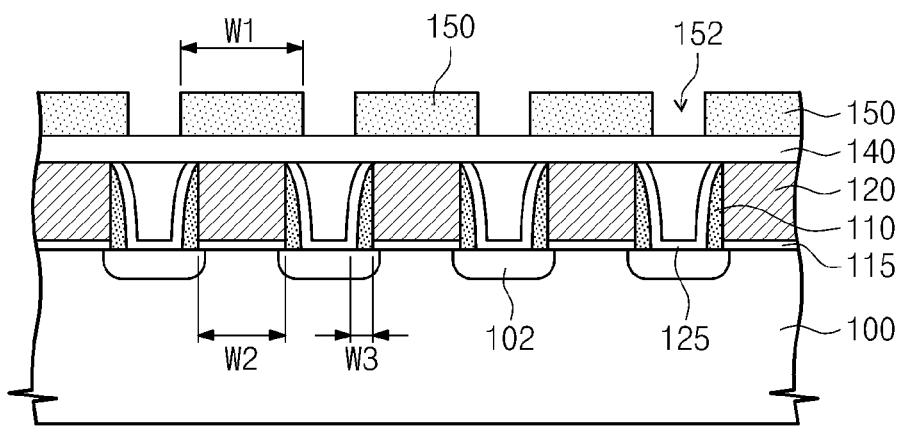

Referring to FIGS. 3A and 3B, gate electrodes 120 may be formed in the first openings 107. The gate electrodes 120 may have exposed upper surfaces. In some exemplary embodiments, the gate electrodes 120 may be formed of, for example, a metal or metal compound. Specifically, in some exemplary embodiments, the gate electrodes 120 may be formed of a metal material, for example, aluminum. Alternatively, the gate electrodes 120 may be formed of a titanium nitride layer or a tantalum nitride layer. Before the gate electrodes 120 are formed, a gate insulating layer 115 is formed on the semiconductor substrate 100.

Any one of the gate electrodes 120 may be used as a gate of a transistor, such as a PMOS transistor, and another one of the gate electrodes 120 may be used as a gate of an NMOS transistor. In this configuration, the gate electrode 120 of the PMOS transistor may be formed with a work function suitable for PMOS, and the gate electrode 120 of the NMOS transistor may be formed with a work function suitable for NMOS. Additionally, the gate electrode 120 of the PMOS transistor and the gate electrode 120 of the NMOS transistor may be formed by a simultaneous process or a separate process.

A second insulating layer 140 covering the first insulating layer 130 and the gate electrodes 120 is formed. The second insulating layer 140 may contact the exposed upper surfaces of the gate electrodes 120. In some exemplary embodiments, the second insulating layer 140 may be formed, for example, a silicon oxide layer. First mask patterns 150 having second openings 152 are formed on the second insulating layer 140. In some exemplary embodiments, the first mask patterns 150 may be formed of for example, a silicon nitride layer. The first mask patterns 150 may be formed with a width W1 which is larger than a width W2 of the gate electrodes 120. Also, the width W1 of the first mask patterns 150 may be greater than or equal to the sum of the width W2 of the gate electrodes 120 and the total width (2×W3) of both spacers 110 on both side surfaces of the gate electrode 120. That is, the relationship of the widths W1, W2, W3 can be W1≥W2+2×W3.

Figure 4A:
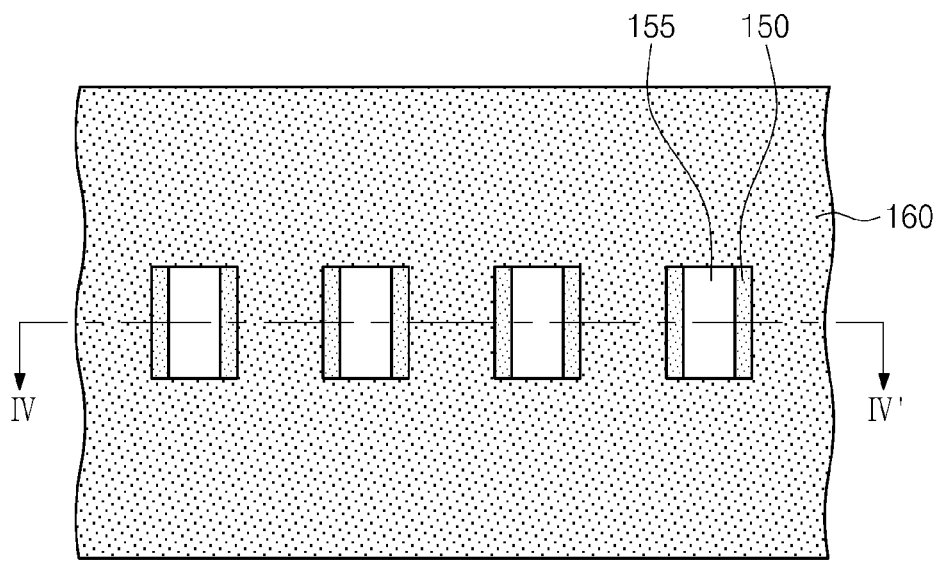
Figure 4B:
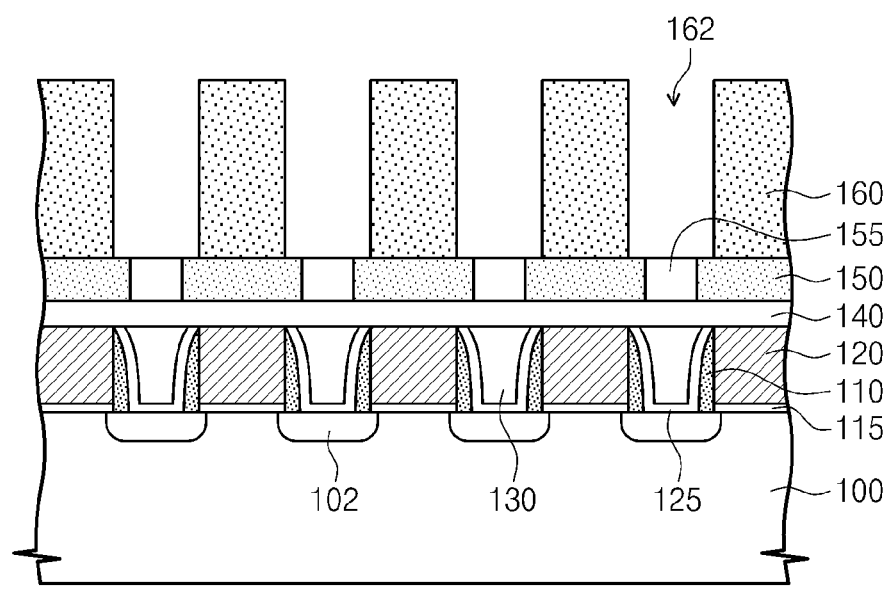

Referring to FIGS. 4A and 4B, a third insulating layer 155 is formed to fill the second openings 152. In some exemplary embodiments, the third insulating layer 155 may be formed of, for example, a silicon oxide layer. Although not shown in the drawing of FIGS. 4A and 4B, the third insulating layer 155 may be formed on the first mask patterns 150 while being formed to fill the second openings 152. Second mask patterns 160 having third openings 162 are formed on the first mask patterns 150. The third openings 162 have a width greater than a width of the second openings 152 and expose the second openings 152. In some exemplary embodiments, the second mask patterns 160 may be formed of, for example, silicon carbonate (SiC). The second openings 152 may be formed in a line shape as shown in FIG. 3A, and the third openings 162 may be formed in a hole or bar shape as shown in FIG. 4A.

Figure 5A:
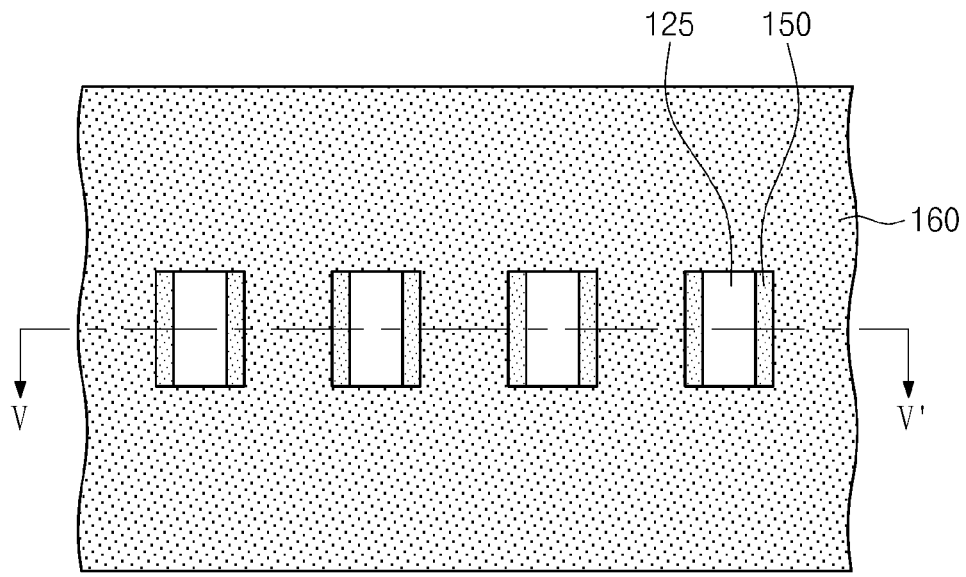
Figure 5B:
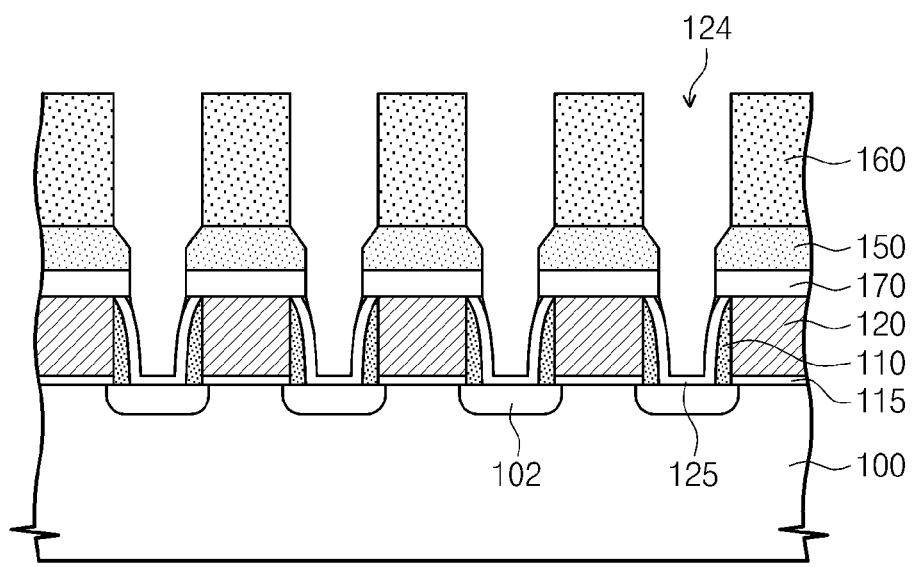

Referring to FIGS. 5A and 5B, the second insulating layer 140 is etched using the first mask patterns 150 and the second mask patterns 160 as a mask to form capping patterns 170. The capping patterns 170 may be formed such that side surfaces of the capping patterns 170 are horizontally offset from the side surfaces of the gate electrodes 120. That is, the side surfaces of the capping patterns 170 may not be coplanar with the side surfaces of the gate electrodes 120. The capping patterns 170 may be formed to have a width which is greater than the width W2 of the gate electrodes 120. Alternatively, the width of the capping patterns 170 may be substantially equal to the width W1 of the first mask patterns 150.

The process of forming the capping patterns 170 may be considered a process of forming a contact hole 124 for self-alignment. The forming of the self-aligned contact hole 124 may be performed using the first mask patterns 150 having the second openings 152 and the second mask patterns 160 having the third openings 162.

The etching of the second insulating layer 140 may include etching the first insulating layer 130 and the third insulating layer 155. That is, the first insulating layer 130 and the second insulating layer 155 may be etched together simultaneously while the second insulating layer 140 is etched. In the etching of the first insulating layer 130, the second insulating layer 140 and the third insulating layer 155, the etch stopper layer 125 may prevent an overetch. That is, the semiconductor substrate 100 may be prevented from being etched by the etch stopper layer 125. Additionally, as shown in FIG. 5B, while the capping patterns 170 are formed, the first mask patterns 150 may be partially etched, as indicated in FIG. 5B by the beveled corners of the first mask patterns 150.

Figure 6A:
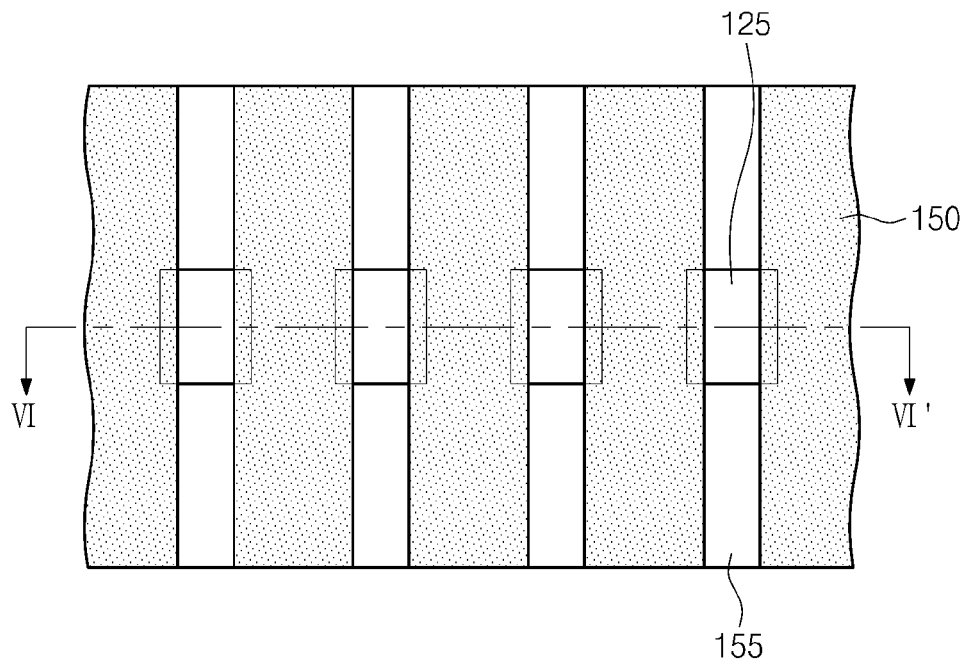
Figure 6B:
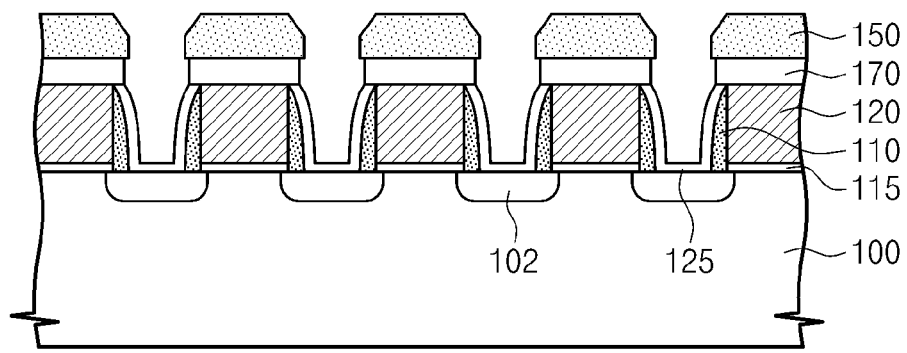

Referring to FIGS. 6A and 6B, after the capping patterns 170 are formed, the second mask patterns 160 are removed. While the second mask patterns 160 are removed, the capping patterns 170 may be partially etched and any portions of the first insulating layer remaining after the etching may be removed.

Figure 7A:
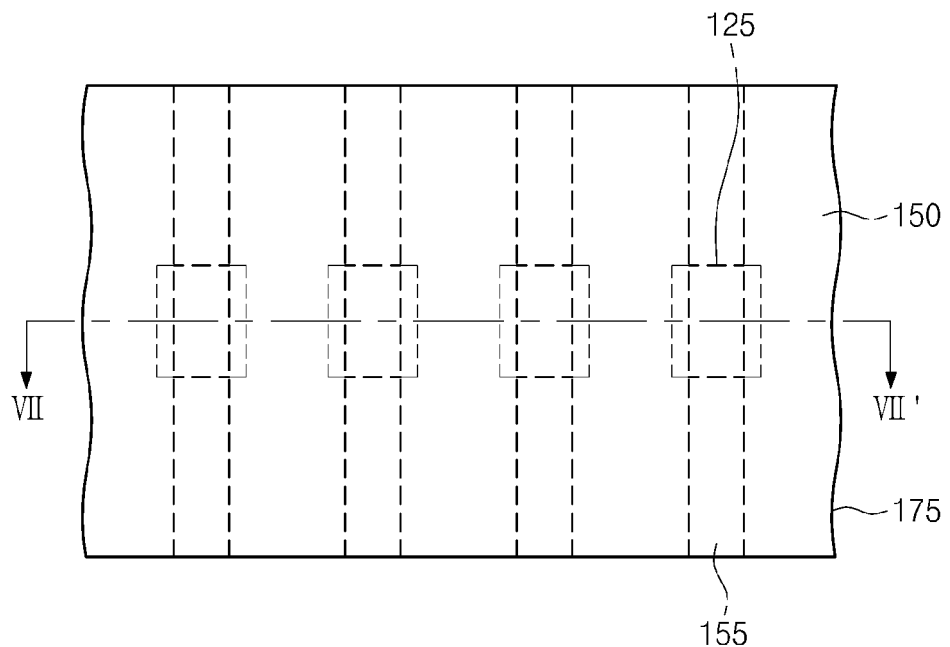
Figure 7B:
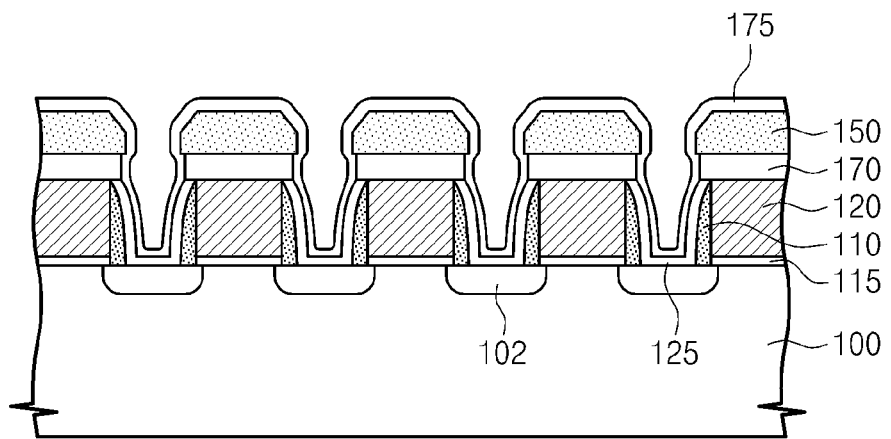

Referring to FIGS. 7A and 7B, a subsidiary insulating layer 175 covering the first mask patterns 150, the capping patterns 170 and the spacers 110 is formed. In some exemplary embodiments, the subsidiary insulating layer 175 may be formed of, for example, a silicon oxide layer. The subsidiary insulating layer 175 may be formed on an entire surface of the structure to improve morphology. That is, the subsidiary insulating layer 175 may be formed to fill in a stepped portion between the first mask patterns 150 and the capping patterns 170 and to fill in a stepped portion between the capping patterns 170 and the etch stopper layer 125.

Figure 8A:
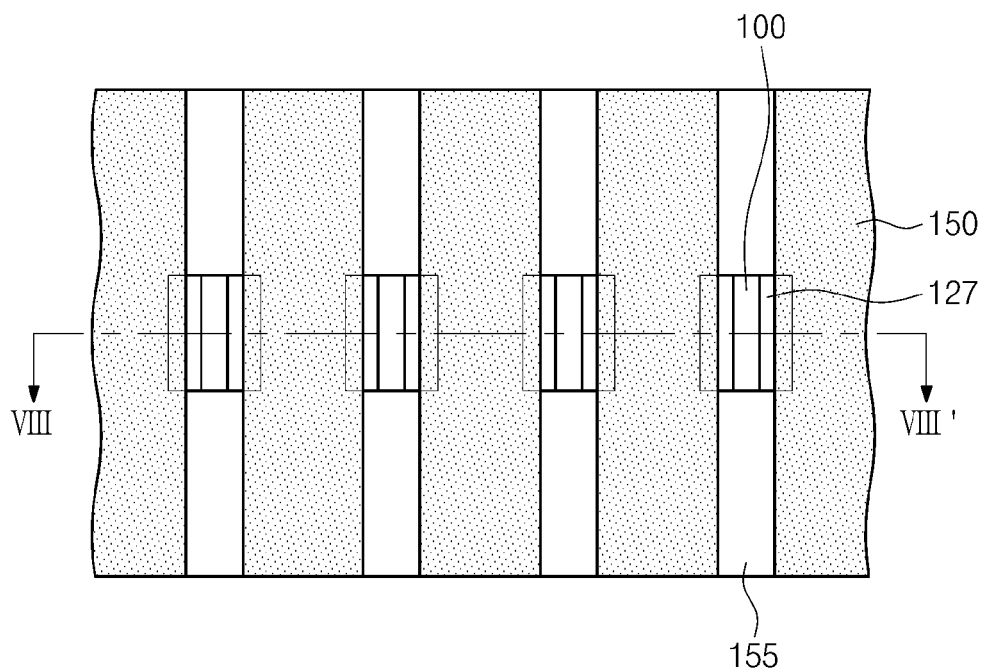
Figure 8B:
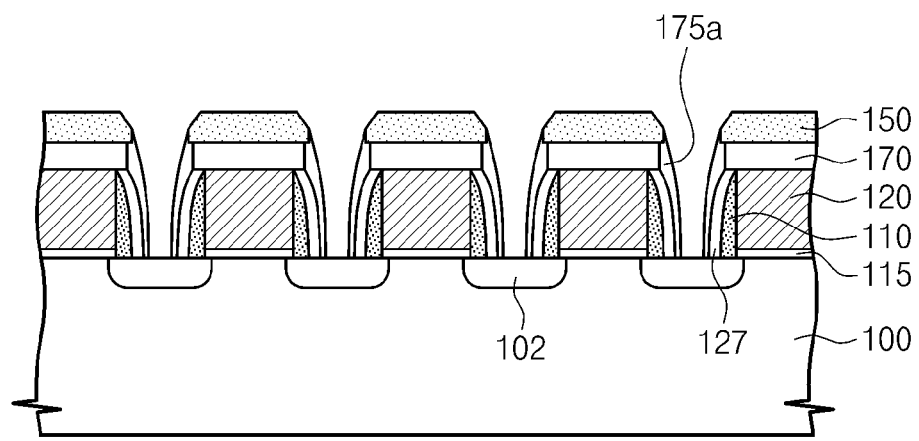

Referring to FIGS. 8A and 8B, the subsidiary insulating layer 175 is blanket-etched. While the subsidiary insulating layer 175 is etched, the etch stopper layer 125 covering the semiconductor substrate 100 may be etched to form etch stopper patterns 127 on the spacers 110. At this time, some of the subsidiary insulating layer 175 may remain on the sidewalls of the capping patterns 170 to form subsidiary spacers 175a. The subsidiary spacers 175a may serve as an electrical insulation of the gate electrodes 120. In the case where the subsidiary insulating layer 175 is completely etched, the subsidiary spacers 175a may not be formed.

Figure 9A:
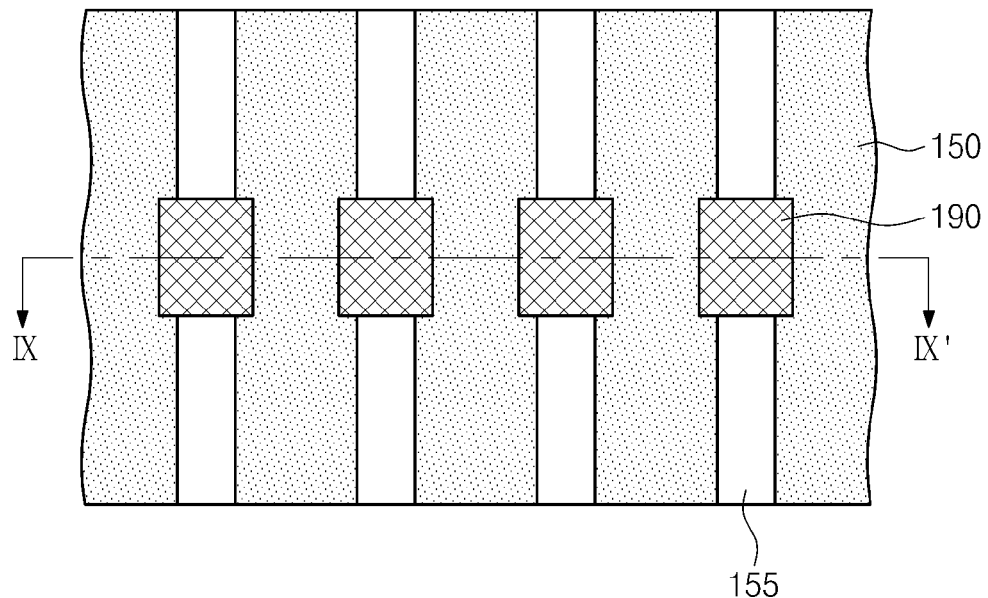
Figure 9B:
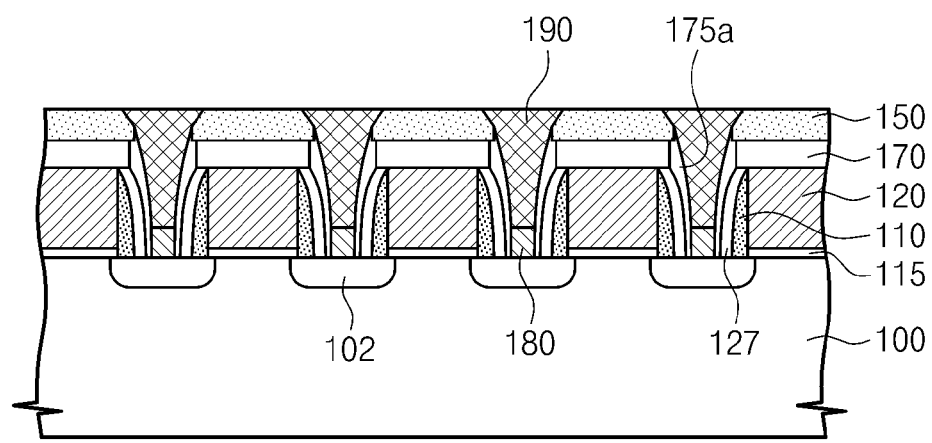

Referring to FIGS. 9A and 9B, a silicide layer 180 is formed on the exposed semiconductor substrate 100 between the subsidiary spacers 175a, or, in the case in which the subsidiary spacers 175a are not formed, between the etch stopper patterns 127. In some exemplary embodiments, the silicide layer 180 may be formed of a nickel (Ni) silicide layer or platinum (Pt) silicide layer. In some exemplary embodiments, the forming of the silicide layer 180 may include forming a metal layer on an entire surface of the semiconductor substrate 100, performing a thermal treatment process to react the metal layer with the semiconductor substrate 100, and removing the metal layer which is not reacted. After the silicide layer 180 is formed, preliminary metal contacts 190 are formed between the gate electrodes 120 on the silicide layer 180. In some exemplary embodiments, the preliminary metal contacts 190 may be formed of tungsten (W), titanium (Ti), or titanium nitride.

Figure 10A:
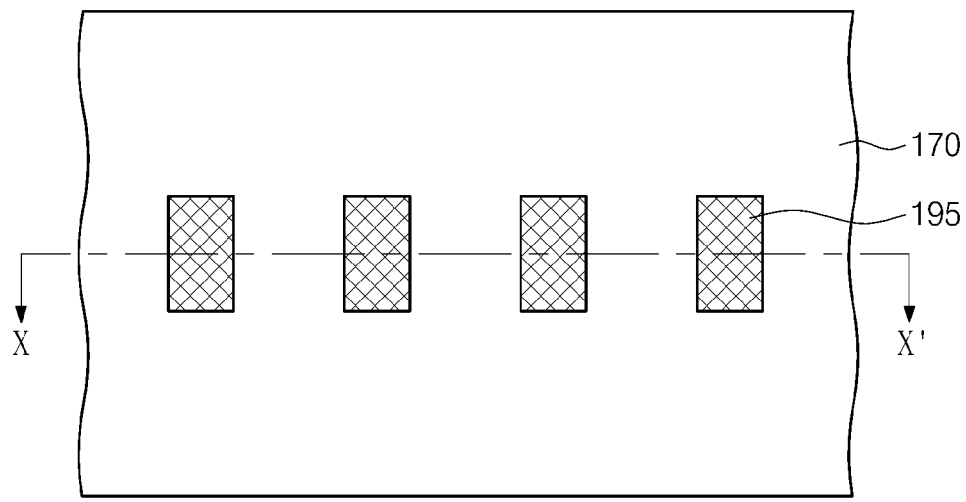
Figure 10B:
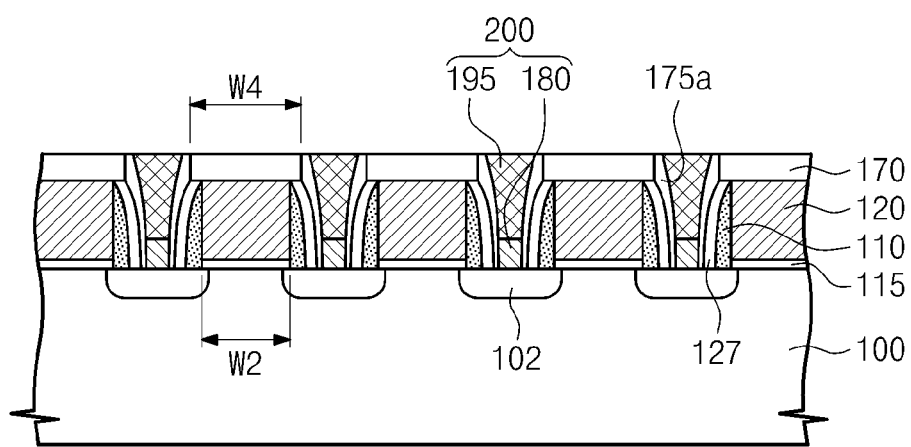

Referring to FIGS. 10A and 10B, the preliminary metal contact 190 and the first mask patterns 150 are at least partially removed to expose the capping patterns 170, so that metal contacts 195 are formed. The preliminary metal contact 190 and the first mask patterns 150 may be at least partially removed by performing a dry etch process. The dry etch process may be terminated through an endpoint detection. Alternatively, the preliminary metal contact 190 and the first mask patterns 150 may be at least partially removed by performing a planarizing process, which can be, for example, a chemical mechanical polishing process. According to the exemplary embodiments of the inventive concept, the metal contacts 195 and the silicide layer 180 may constitute a self-aligned contact 200.

Although the self-aligned contact 200 may be somewhat misaligned and thus some of the capping patterns 170 are etched, since the width of the capping patterns 170 is greater than the width of the gate electrodes 120, a process margin is ensured. Also, when the misalignment of the self-aligned contact 200 is within the process margin, if centers of the gate electrodes 120 are set as an imaginary reference line, the spacers 110 and the capping patterns 170 may be formed asymmetrically. Although the misalignment is generated within the process margin, the self-aligned contact 200 may not be electrically shorted with the gate electrodes 120. As described in accordance with an exemplary embodiment of the present inventive concept, it will be understood that a semiconductor device including the spacers 110, the etch stopper patterns 127 and the capping patterns 170 which are formed asymmetrically with the self-aligned contact 200 misaligned within the process margin as well as the case in which the self-aligned contact 200 is correctly aligned are included within the scope of the present inventive concept.

According to an exemplary embodiment of the present inventive concept, the self-aligned contact 200 is formed between the gate electrodes 120. As the capping patterns 170 having a greater width than the width of the gate electrodes 120 are formed, an electrical short between the metal contact 195 and the gate electrodes 120 can be effectively prevented.

Hereinafter, a semiconductor device according to an exemplary embodiment of the present inventive concept will be described.

Again referring to FIGS. 10A and 10B, gate electrodes 120 are disposed on a semiconductor substrate 100. A gate insulating layer 115 is disposed between the gate electrodes 120 and the semiconductor substrate 100. According to various exemplary embodiments, the gate insulating layer 115 may be formed of any of various insulating materials such as silicon oxide or the like. In some exemplary embodiments, the gate electrodes 120 may include, for example, aluminum, titanium nitride or tantalum nitride. Spacers 110 are disposed on side surfaces of the gate electrodes 120. In some exemplary embodiments, the spacers 110 may include, for example, a silicon nitride layer.

Capping patterns 170 are disposed on the gate electrodes 120. In some exemplary embodiments, the capping patterns 170 may include, for example, a silicon oxide layer. Subsidiary spacers 175a may be disposed on side surfaces of the capping patterns 170 and spacers 110. In some exemplary embodiments, the subsidiary spacers 175a may include, for example, a silicon oxide layer. A width W4 of the capping patterns 170 may be greater than the width W2 of the gate electrodes 120. The capping patterns 170 may cover upper surfaces of the gate electrodes 120 and some of the spacers 110. A metal contact 195 is disposed between the gate electrodes 120. In some exemplary embodiments, the metal contact 195 may include, for example, tungsten, titanium or titanium nitride.

Etch stopper patterns 127 may be disposed between the spacers 110 and the metal contact 195 while covering the spacers 110. In some exemplary embodiments, the etch stopper patterns 127 may include, for example, a silicon nitride layer. A silicide layer 180 may be disposed between the semiconductor substrate 100 and the metal contact 195. In some exemplary embodiments, the silicide layer 180 may include, for example, a nickel silicide layer or a platinum silicide layer. The metal contact 195 and the silicide layer 180 may constitute a self-aligned contact 200. Because the capping patterns 170 have a width greater than the width of the gate electrodes 120, electrical shorting of the self-aligned contact 200 and the gate electrodes 120 is prevented.

Figure 11:
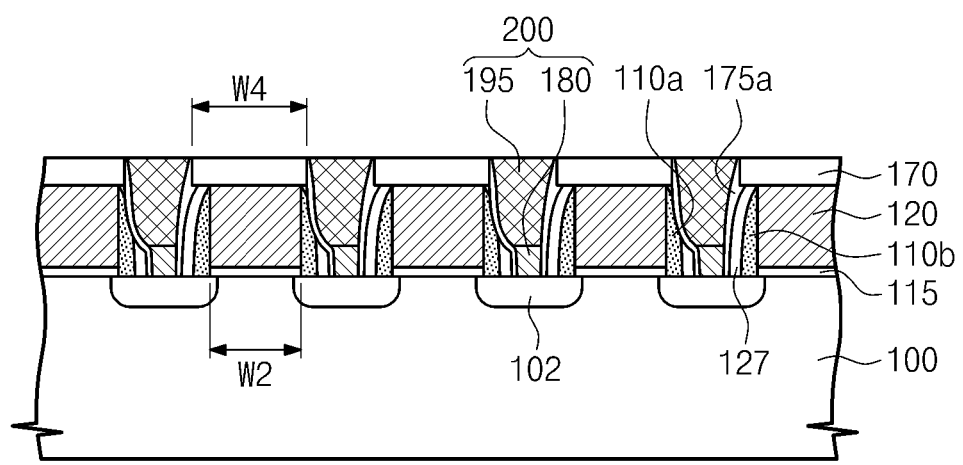
FIG. 11 is a schematic cross-sectional view illustrating a method of forming a semiconductor device according to a modified exemplary embodiment of the present inventive concept.

FIG. 11 is a schematic cross-sectional view illustrating a method of forming a semiconductor device according to another exemplary embodiment of the present inventive concept. Detailed description of the elements of FIG. 11 that are the same as those of FIG. 10B will not be repeated.

Referring to FIG. 11, first spacers 110a disposed on one side surface of the gate electrodes 120 have an upper portion which is recessed. When the capping patterns 170 are not completely aligned with the gate electrodes 120 within an alignment margin, the first spacers 110a may have an upper surface which is recessed. Since the capping patterns 170 have the width W4 greater than the width W2 of the gate electrodes 120, although the capping patterns 170 are not completely aligned with the gate electrodes 120 within the alignment margin, an electrical short is eliminated, according to the embodiments of the inventive concept.

The first spacers 110a disposed on one side surface of the gate electrodes 120 may have a shape different from second spacers 110b disposed on the other side surface of the gate electrodes 120. That is, the second spacers 110b may be completely covered by the capping patterns 170 and upper portions thereof may not be recessed. It will be understood that, in general, the first and second spacers 110a and 110b have an asymmetric shape with respect to the gate electrodes 120.

The feature that the capping patterns 170 are not necessarily completely aligned with the gate electrodes 120 may be described with reference to FIG. 3B. Referring to FIG. 3B, if the first mask patterns 150 are not completely aligned with the gate electrodes 120, the capping patterns 170 may be formed as shown in FIG. 11. The semiconductor device according to the embodiment of the present inventive concept may ensure a sufficient alignment margin capable of preventing creation of an electrical short. The exemplary embodiment described with reference to FIG. 11 may be applied to another exemplary embodiment, which will be described in detail below.

FIGS. 12A through 17B are schematic views illustrating a method of forming a semiconductor device according to another exemplary embodiment of the present inventive concept. Specifically, FIGS. 12A, 13A, 14A, 15A, 16A and 17A are schematic plan views illustrating a method of forming a semiconductor device according to another embodiment of the present inventive concept, and FIGS. 12B, 13B, 14B, 15B, 16B and 17B are schematic cross-sectional views taken along lines XI-XI', XII-XII', XIII-XIII', XIV-XIV', XV-XV' and XVI-XVI' of FIGS. 12A, 13A, 14A, 15A, 16A and 17A, respectively.

Detailed description of the technical features of the current exemplary embodiment which are substantially the same as those of the exemplary embodiment described in detail above with reference to FIGS. 1A through 3B will not be repeated.

Figure 12A:
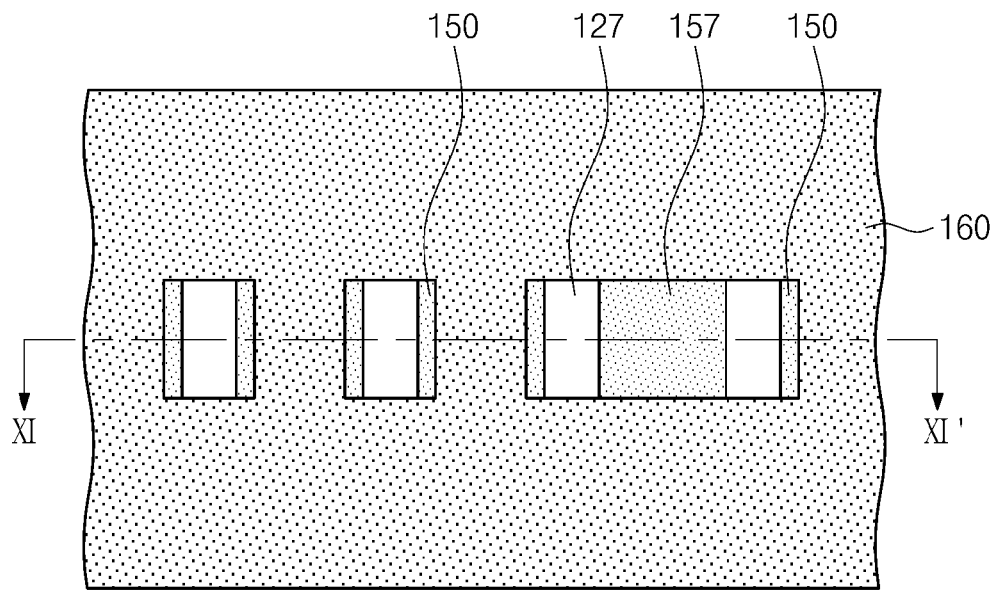
Figure 12B:
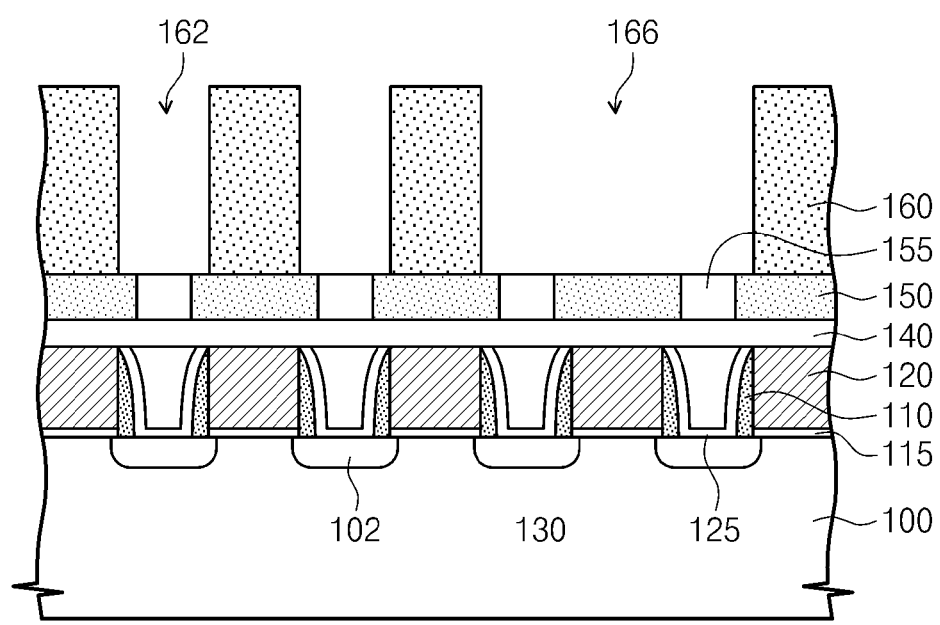

Referring to FIGS. 12A and 12B, a third insulating layer 155 filling the second openings 152 described with reference to FIGS. 3A and 3B is formed. In some exemplary embodiments, the third insulating layer 155 may be formed of, for example, a silicon oxide layer. Second mask patterns 160 are formed. The second mask patterns 160 have third openings 162 which are greater in width than the width of the second openings 152. The third openings 162 expose the second openings 152. In some exemplary embodiments, the second mask patterns 160 may be formed of, for example, silicon carbonate (SiC). The second openings 152 may be formed in a line shape as shown in FIG. 3A, and the third openings 162 may be formed in a hole or bar shape as shown in FIG. 12A.

According to another exemplary embodiment of the present inventive concept, in contrast to the previously described embodiments of the present inventive concept, the second mask patterns 160 may include an extending opening 166 which extends between the third openings 162 to expose adjacent second openings 152. The extending opening 166 expose at least one of the first mask patterns 150.

Figure 13A:
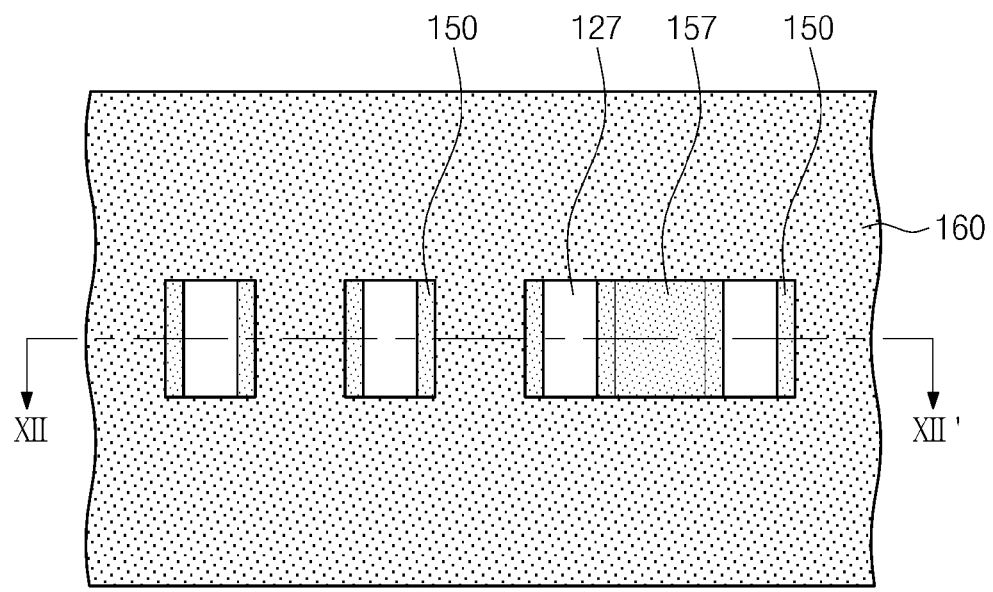
Figure 13B:
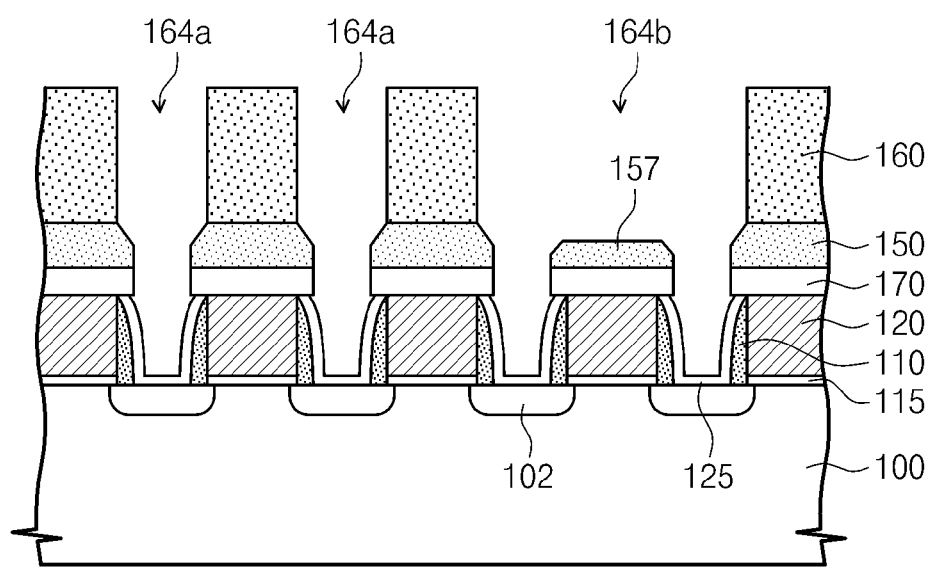

Referring to FIGS. 13A and 13B, the second insulating layer 140 is etched using the first mask patterns 150 and the second mask patterns 160 as a mask to form capping patterns 170. A side surface of the capping pattern 170 and a side surface of the gate electrode 120 may be formed on different planes. That is, the side surface of the capping pattern 170 may not be coplanar with the side surface of the gate electrode 120. The capping patterns 170 may be formed with a width greater than the width of the gate electrodes 120. Alternatively, the capping patterns 170 may be formed with a width substantially equal to the width W1 of the gate electrodes 120. The forming of the capping patterns 170 may include etching at least some of the first mask pattern 150 exposed by the extending opening 166 to form a recess pattern 157.

The process of forming the capping patterns 170 is a process of forming first and second contact holes 164a and 164b for self-alignment. The first and second self-aligned contact holes 164a and 164b may be formed using first mask patterns 150 having the second opening 152 and second mask patterns 160 having the third opening 162. The second contact hole 164b may be formed using the second mask patterns 160 having the extending opening 166.

The etching of the second insulating layer 140 may include etching the first insulating layer 130 and the third insulating layer 155. That is, while the second insulating layer 140 is etched, the first insulating layer 130 and the third insulating layer 155 may be etched together with the second insulating layer 140. In the etching of the first insulating layer 130, the second insulating layer 140 and the third insulating layer 155, the etch stopper layer 125 may prevent an overetch. That is, the semiconductor substrate 100 may be prevented from being etched by the etch stopper layer 125. Additionally, as shown in FIG. 13B, in the forming of the capping patterns 170, the first mask patterns 150 may be partially etched.

Figure 14A:
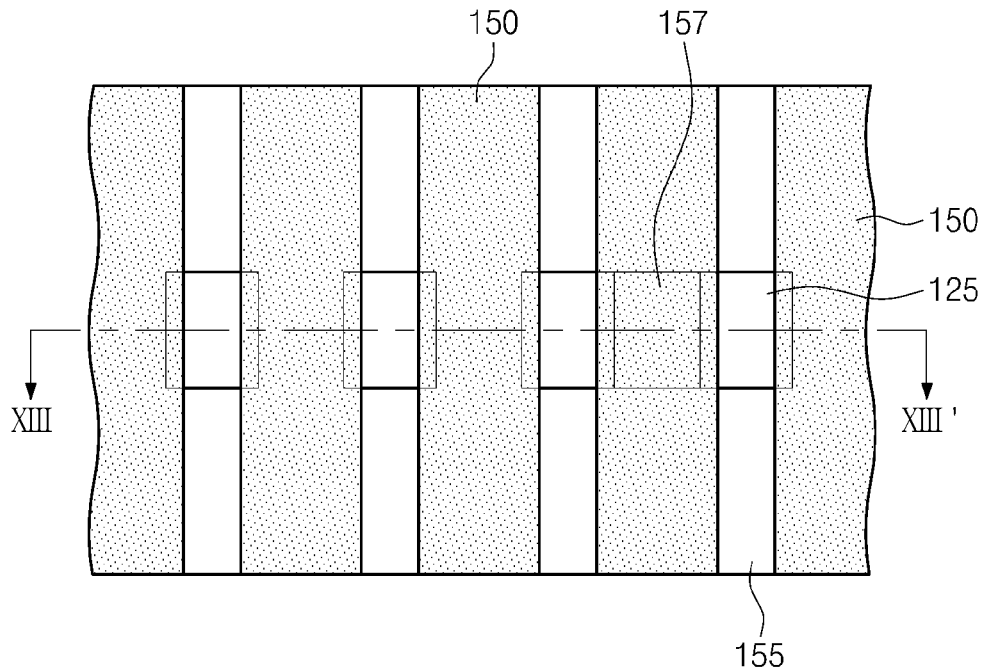
Figure 14B:
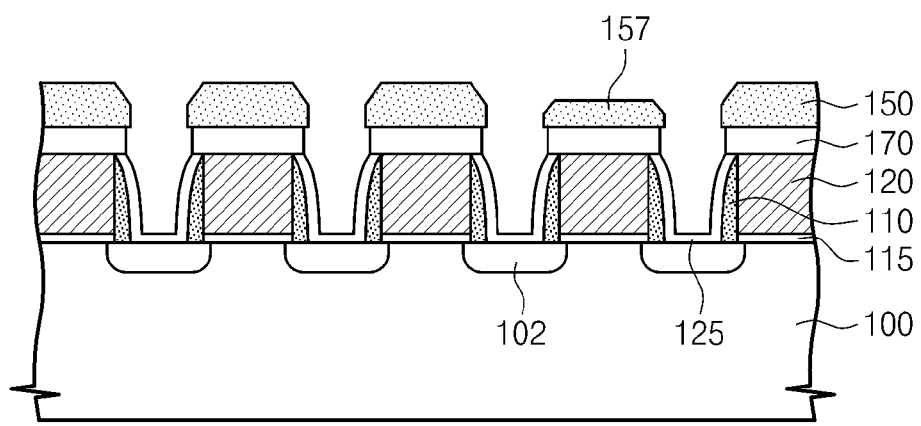

Referring to FIGS. 14A and 14B, after the capping patterns 170 are formed, the second mask patterns 160 are removed. While the second mask patterns 160 are removed, the capping patterns 170 may be partially etched, and any remaining first insulating layer 130 may be removed.

Figure 15A:
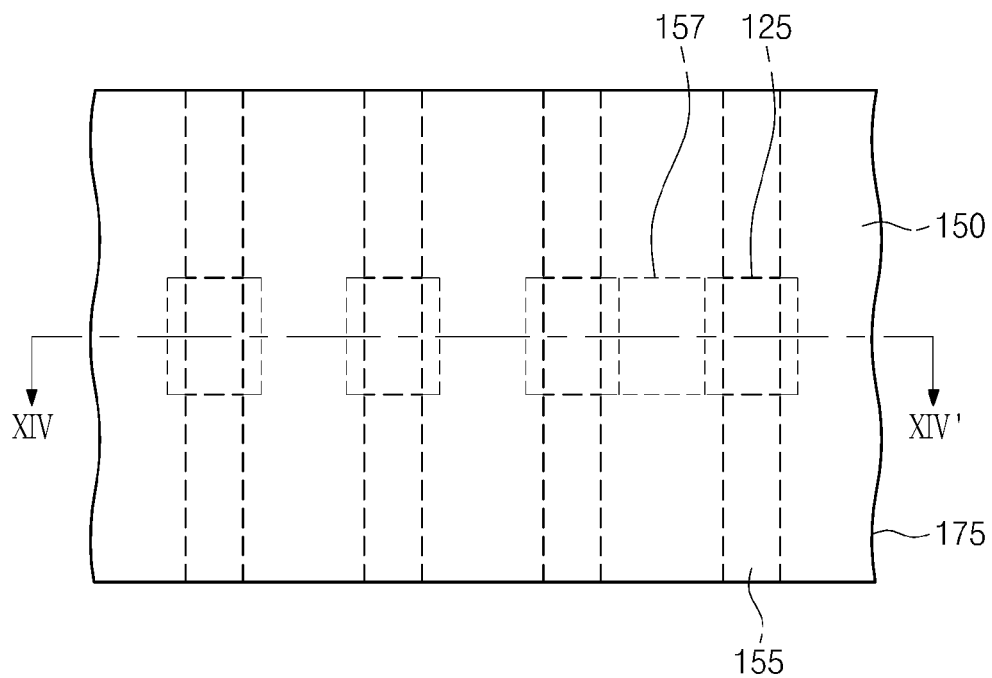
Figure 15B:
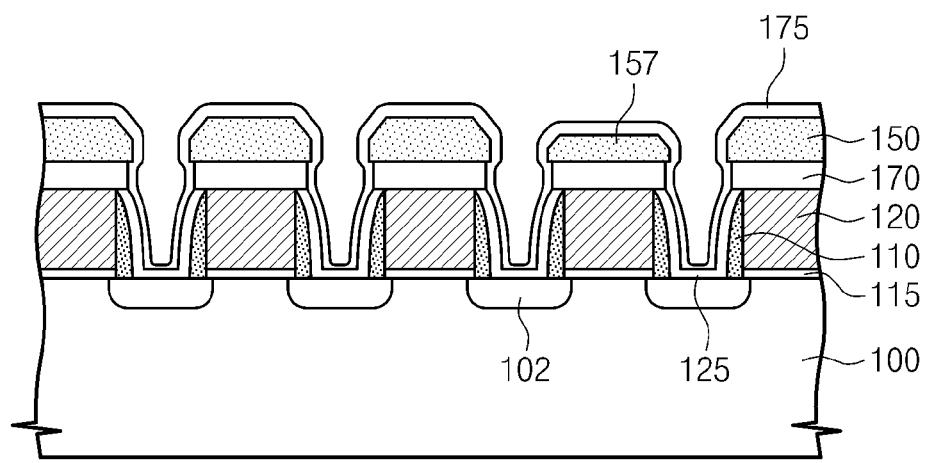

Referring to FIGS. 15A and 15B, a subsidiary insulating layer 175 covering the first mask patterns 150, the capping patterns 170 and the spacers 110 is formed. In some exemplary embodiments, the subsidiary insulating layer 175 may be formed of, for example, a silicon oxide layer. The subsidiary insulating layer 175 may be formed on an entire surface of the resultant structure to improve morphology. That is, the subsidiary insulating layer 175 may be formed to fill in a stepped portion between the first mask patterns 150 and the capping patterns 170 and to fill in a stepped portion between the capping patterns 170 and the etch stopper layer 125.

Figure 16A:
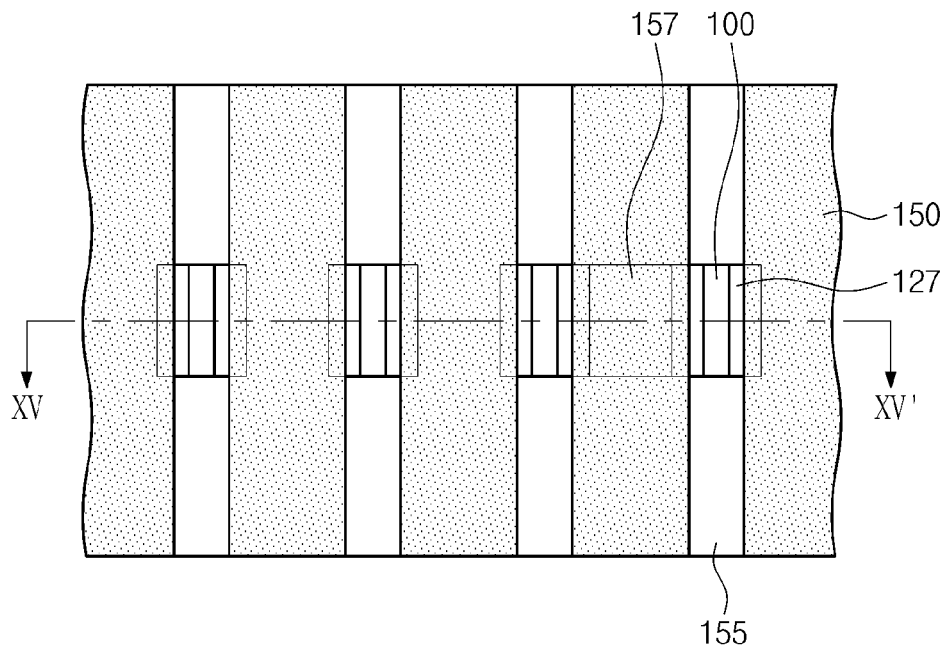
Figure 16B:
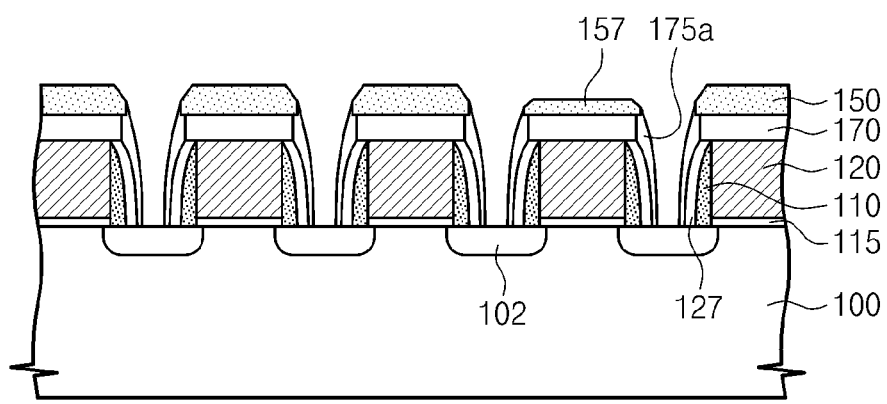

Referring to FIGS. 16A and 16B, the subsidiary insulating layer 175 is blanket etched. While the subsidiary insulating layer 175 is etched, the etch stopper layer 125 covering the semiconductor substrate 100 may be etched to form etch stopper patterns 127 on the spacers 110. Some of the subsidiary insulating layer 174 may remain on the side surfaces of the capping patterns 170 to form subsidiary spacers 175a. In the case where the subsidiary insulating layer 175 is completely etched, the subsidiary spacers 175a may not be formed.

Figure 17A:
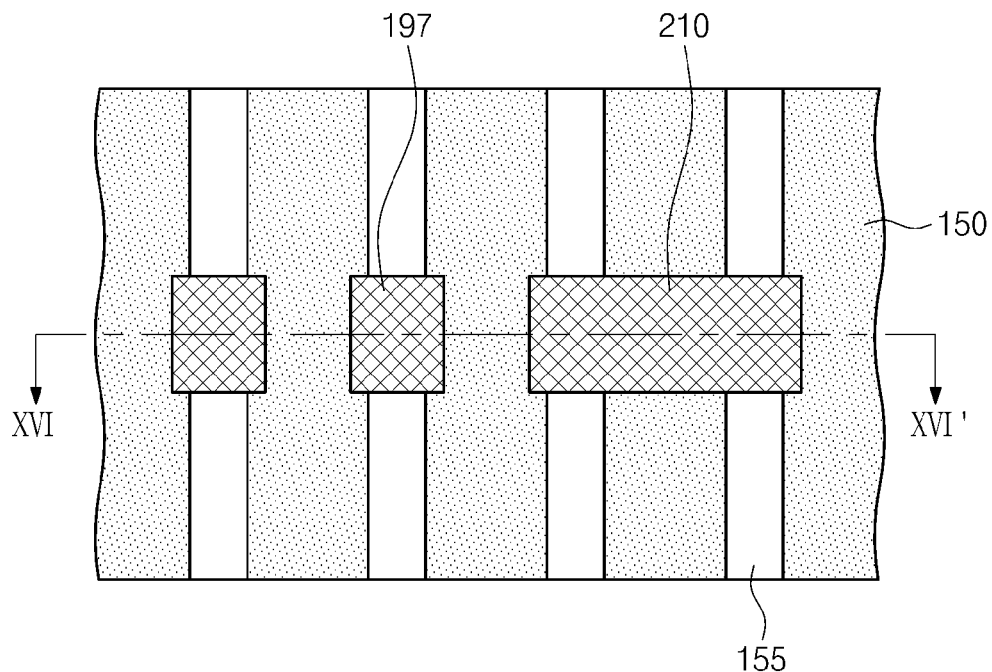
Figure 17B:
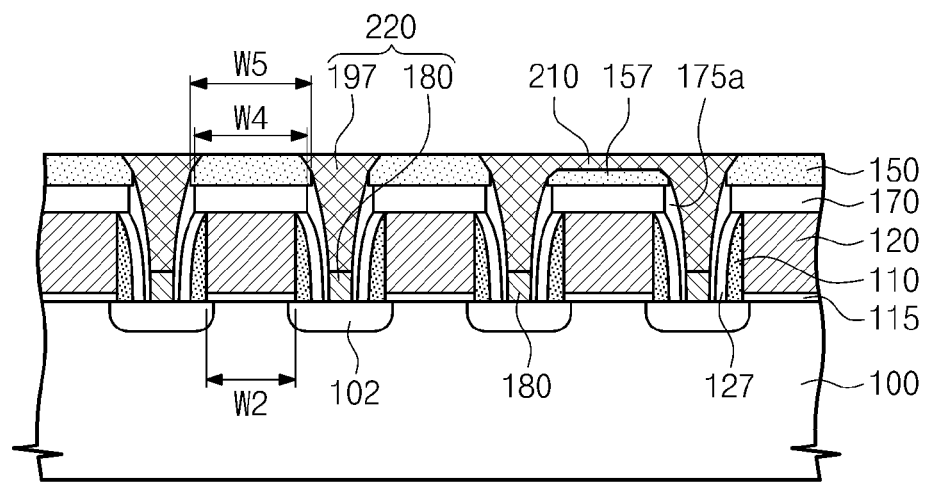

Referring to FIGS. 17A and 17B, a silicide layer 180 is formed on the exposed semiconductor substrate 100 between the subsidiary spacers 175a, or, in the case in which the subsidiary spacers 175a are not formed, between the etch stopper patterns 127. In some exemplary embodiments, the silicide layer 180 may be formed of a nickel silicide layer or a platinum silicide layer. In some exemplary embodiments, the forming of the silicide layer 180 may include forming a metal layer on an entire surface of the semiconductor substrate 100, performing a thermal treatment of the metal layer to react the metal layer with the semiconductor substrate 100 and removing any portion of the metal layer which is not reacted. Metal contacts 197 are formed between the gate electrodes 120 on the silicide layer 180. In some exemplary embodiments, the metal contacts 197 may be formed of tungsten, titanium or titanium nitride.

In some exemplary embodiments, the forming of the metal contacts 197 may include forming a metal layer filling a space between the gate electrodes 120 and etching some of the metal layer to expose at least one of the first mask patterns 150. The metal contacts 197 may be connected to each other on the recess pattern 157 to form a metal interconnection 210.

According to another exemplary embodiment of the present inventive concept, in contrast to other exemplary embodiments described in detail above, the first mask patterns 150 may not be removed. The first mask patterns 150 may include at least one recess pattern 157, and the metal interconnection 210 may be formed on the recess pattern 157. Also, a self-aligned contact 200 is formed between the gate electrodes 120.

The capping patterns 170 may be formed with a width W4, which is greater than a width W2 of the gate electrodes 120, and the first mask patterns 150 may be formed with a width W5 greater than the width W4 of the capping patterns 170. Since the capping patterns 170 and the first mask patterns 150, which are greater in width than the gate electrodes 120, are formed on the gate electrodes 120, an electrical short between the metal contacts 197 and the gate electrodes 120 can be effectively prevented.

Hereinafter, a semiconductor device according to another exemplary embodiment of the present inventive concept will be described in detail.

Referring to FIGS. 17A and 17B, in some exemplary embodiments, gate electrodes 120 are disposed on a semiconductor substrate 100. A source/drain region 102 may be disposed in the semiconductor substrate adjacent to the gate electrodes 120. In some exemplary embodiments, the gate electrodes 120 may include, for example, aluminum, titanium nitride or tantalum nitride. Spacers 110 are disposed on side surfaces of the gate electrodes 120. In some exemplary embodiments, the spacers 110 may include a silicon nitride layer.

Capping patterns 170 are disposed on the gate electrodes 120. In some exemplary embodiments, the capping patterns 170 may include, for example, a silicon oxide layer. Subsidiary spacers 175a may be disposed on side surfaces of the capping patterns 170 and spacers 110. In some exemplary embodiments, the subsidiary spacers 175a may include a silicon oxide layer. A width W4 of the capping patterns 170 may be greater than the width W2 of the gate electrodes 120. The capping patterns 170 may cover upper surfaces of the gate electrodes 120 and some of the spacers 110. A metal contact 197 is disposed between the gate electrodes 120. In some exemplary embodiments, the metal contact 197 may include, for example, tungsten, titanium or titanium nitride.

Mask patterns 150 are disposed on the capping patterns 170. The mask patterns 150 may extend in one direction to cover the gate electrodes 120. The mask patterns 150 may have a width W5 which is greater than the width W2 of the gate electrodes 120.

Etch stopper patterns 127 covering the spacers 110 may be disposed between the spacers 110 and the metal contact 197. In some exemplary embodiments, the etch stopper patterns 127 may include, for example, a silicon nitride layer. A silicide layer 180 may be disposed between the semiconductor substrate 100 and the metal contact 197. In some exemplary embodiments, the silicide layer 180 may include, for example, a nickel silicide layer or a platinum silicide layer. The metal contact 197 and the silicide layer 180 may constitute a self-aligned contact 200.

Because the capping patterns 170 have a greater width than the gate electrodes 120, the self-aligned contact 200 may not be electrically shorted with the gate electrodes 120. Also, because the mask patterns 150 have a greater width W5 than the width W2 of the gate electrodes 120, the self-aligned contact 200 may not be electrically shorted with the gate electrodes 120.

An upper surface of the metal contact 197 may be substantially the same as, i.e., at the same vertical level as, upper surfaces of at least some of the mask patterns 150. The mask patterns 150 may include a recess pattern 157 having an upper surface which is lower than the upper surface of the metal contact 197. The recess pattern 157 may be thinner than the mask patterns 150 adjacent to the recess pattern. The metal contacts 197 disposed at both sides of the recess pattern 157 may be connected to each other on the recess pattern 157 to constitute a metal interconnection 210.

Figure 18:
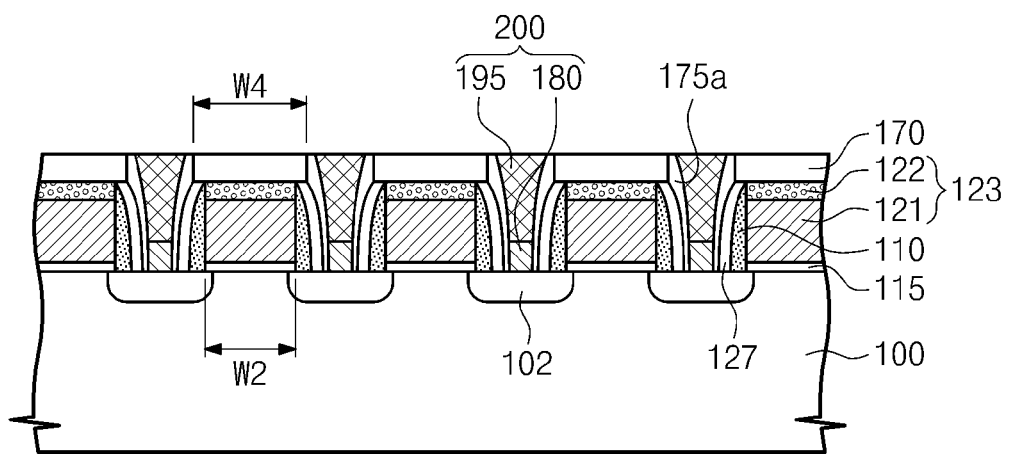
FIG. 18 is a schematic cross-sectional view illustrating a semiconductor device according to another exemplary embodiment of the present inventive concept.

FIG. 18 is a schematic cross-sectional view illustrating a semiconductor device according to an exemplary embodiment of the present inventive concept.

Referring to FIG. 18, gate patterns 123 are disposed on a semiconductor substrate 100. One or more source/drain regions 102 may be disposed in the semiconductor substrate adjacent to the gate patterns 123. A gate insulating layer 115 is disposed between the gate patterns 123 and the semiconductor substrate 100. In some exemplary embodiments, the gate insulating layer 115 may be formed of various insulating material such as, for example, a silicon oxide layer or the like. The gate patterns 123 may include a conductive pattern 121 and a capping insulating layer 122 on the conductive pattern 121. In some exemplary embodiments, the conductive pattern 121 may include, for example, an aluminum layer. In some exemplary embodiments, the capping insulating layer 122 may include, for example, an aluminum oxide layer. The aluminum oxide layer may be formed by oxidizing an aluminum layer. In the method of forming a semiconductor device according to the embodiment described with reference to FIGS. 3A and 3B, by forming a gate electrode including aluminum and oxidizing the gate electrode, the conductive pattern 121 comprised of aluminum and the capping insulating layer 122 comprised of an aluminum oxide layer may be formed.

Spacers 110 are disposed on side surfaces of the gate patterns 123. In some exemplary embodiments, the spacers 110 may include, for example, a silicon nitride layer. Capping patterns 170 are disposed on the gate patterns 123. In some exemplary embodiments, the capping patterns 170 may include, for example, a silicon oxide layer. Subsidiary spacers 175a may be disposed on side surfaces of the capping patterns 170 and spacers 110. The subsidiary spacers 175a may include a silicon oxide layer. A width W4 of the capping patterns 170 may be greater than the width W2 of the gate patterns 123. The capping patterns 170 may cover upper surfaces of the gate patterns 123 and some of the spacers 110. A metal contact 195 is disposed between the gate patterns 123. In some exemplary embodiments, the metal contact 195 may include, for example, tungsten, titanium or titanium nitride.

Etch stopper patterns 127 covering the spacers 110 may be disposed between the spacers 110 and the metal contact 195. In some exemplary embodiments, the etch stopper patterns 127 may include, for example, a silicon nitride layer. A silicide layer 180 may be disposed between the semiconductor substrate 100 and the metal contact 195. In some exemplary embodiments, the silicide layer 180 may include, for example, a nickel silicide layer or a platinum silicide layer. The metal contact 195 and the silicide layer 180 may constitute a self-aligned contact 200. Because the capping patterns 170 have a greater width than the width of the gate patterns 123, the self-aligned contact 200 may not be electrically shorted with the gate patterns 123.

Figure 19:
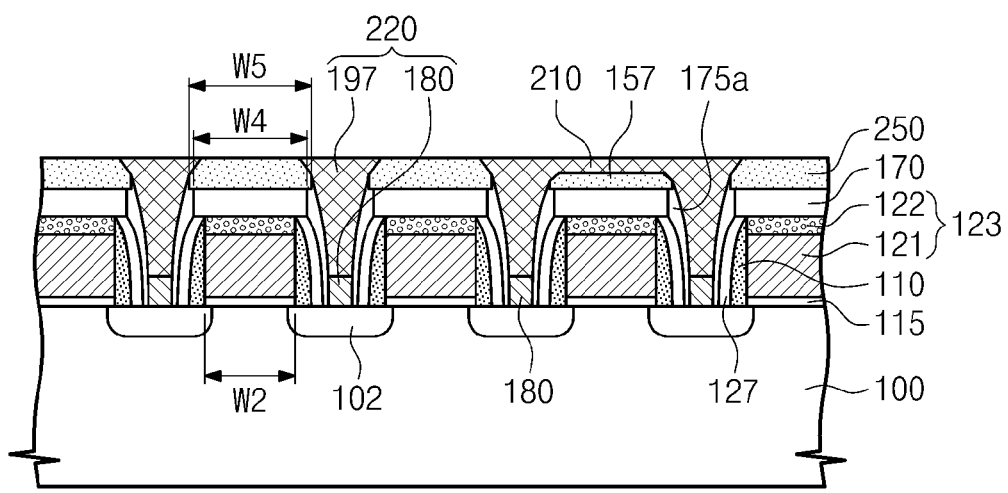
FIG. 19 is a schematic cross-sectional view illustrating a semiconductor device according to another modified exemplary embodiment of the present inventive concept.

FIG. 19 is a schematic cross-sectional view illustrating a semiconductor device according to another exemplary embodiment of the present inventive concept.

Referring to FIG. 19, gate patterns 123 are disposed on a semiconductor substrate 100. One or more source/drain regions 102 may be disposed in the semiconductor substrate adjacent to the gate patterns 123. A gate insulating layer 115 is disposed between the gate patterns 123 and the semiconductor substrate 100. The gate patterns 123 may include a conductive pattern 121 and a capping insulating layer 122 on the conductive pattern 121. In some exemplary embodiments, the conductive pattern 121 may include, for example, an aluminum layer. In some exemplary embodiments, the capping insulating layer 122 may include, for example, an aluminum oxide layer. The aluminum oxide layer may be formed by oxidizing an aluminum layer. In the method of forming a semiconductor device according to the embodiment described with reference to FIGS. 3A and 3B, by forming a gate electrode including aluminum and oxidizing the gate electrode, the conductive pattern 121 comprised of aluminum and the capping insulating layer 122 comprised of an aluminum oxide layer may be formed.

Spacers 110 are disposed on side surfaces of the gate patterns 123. In some exemplary embodiments, the spacers 110 may include, for example, a silicon nitride layer. Capping patterns 170 are disposed on the gate patterns 123. In some exemplary embodiments, the capping patterns 170 may include, for example, a silicon oxide layer. Subsidiary spacers 175a may be disposed on side surfaces of the capping patterns 170 and spacers 110. In some exemplary embodiments, the subsidiary spacers 175a may include, for example, a silicon oxide layer. A width W4 of the capping patterns 170 may be greater than the width W2 of the gate patterns 123. The capping patterns 170 may cover upper surfaces of the gate patterns 123 and some of the spacers 110. A metal contact 197 is disposed between the gate patterns 123. In some exemplary embodiments, the metal contact 197 may include, for example, tungsten, titanium or titanium nitride.

Mask patterns 250 are disposed on the capping patterns 170. The mask patterns 250 may extend in one direction to cover the gate patterns 123 (see FIG. 18). The mask patterns 250 may have a width W5 which is greater than the width W2 of the gate patterns 123.

Etch stopper patterns 127 covering the spacers 110 may be disposed between the spacers 110 and the metal contact 197. In some exemplary embodiments, the etch stopper patterns 127 may include, for example, a silicon nitride layer. A silicide layer 180 may be disposed between the semiconductor substrate 100 and the metal contact 197. In some exemplary embodiments, the silicide layer 180 may include, for example, a nickel silicide layer or a platinum silicide layer. The metal contact 197 and the silicide layer 180 may constitute a self-aligned contact 200.

Because the capping patterns 170 have a greater width than the gate patterns 123, the self-aligned contact 200 may not be electrically shorted with the gate patterns 123. Also, because the mask patterns 250 have a greater width W5 than the width W2 of the gate patterns 123, the self-aligned contact 200 may not be electrically shorted with the gate electrodes 120.

An upper surface of the metal contact 197 may be substantially the same as, i.e., at the same vertical level as, upper surfaces of at least some of the mask patterns 250. The mask patterns 250 may include a recess pattern 157 having an upper surface which is lower than the upper surface of the metal contact 197. The recess pattern 157 may be thinner than the mask patterns 250 adjacent to the recess pattern 157. The metal contacts 197 disposed at both sides of the recess pattern 157 may be connected to each other on the recess pattern 157 to constitute a metal interconnection 210.

Figure 20:
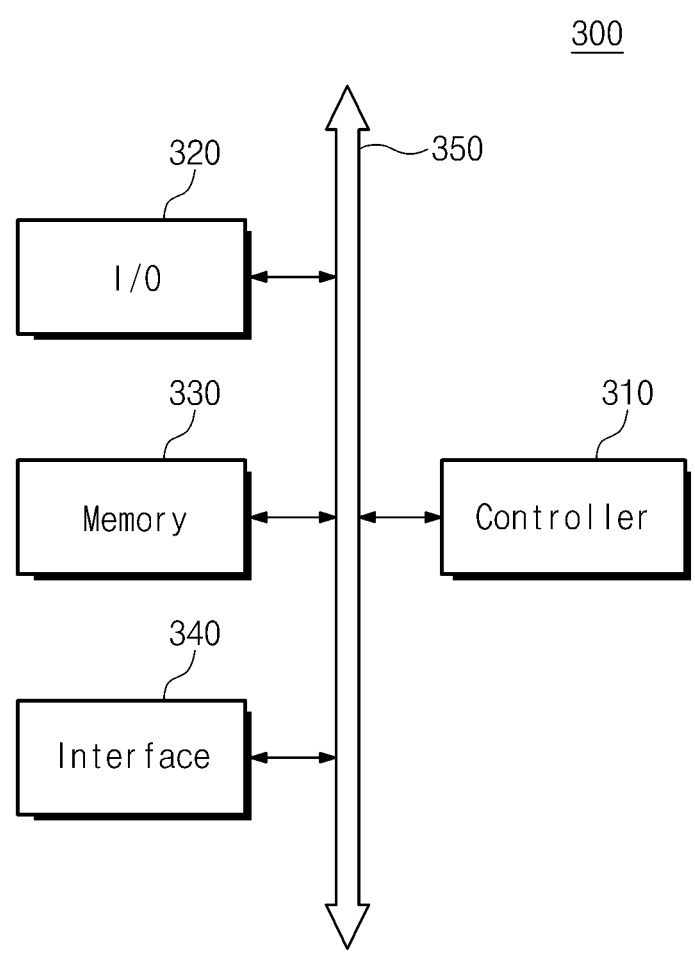
FIG. 20 is a schematic block diagram illustrating an example of a memory system including a semiconductor device according to the exemplary embodiments of the present inventive concept described herein in detail.

FIG. 20 is a schematic block diagram illustrating an exemplary embodiment of a memory system according to the inventive concept. The memory system of FIG. 20 includes a semiconductor device according to one or more of the exemplary embodiments described herein in detail, formed according to one or more of the exemplary embodiments described herein in detail.

The semiconductor device according to the foregoing exemplary embodiments may be implemented by a logic device performing a processing operation on logic data. Alternatively, the semiconductor device according to the foregoing exemplary embodiments may be implemented by a memory device storing data. In the case where the foregoing semiconductor devices are implemented by memory devices, a data storage element storing data on the metal contact may be formed. In some exemplary embodiments, the data storage element may be a capacitor, a variable resistor or the like.

Referring to FIG. 20, a memory system 300 may be applicable to PDAs, portable computers, Web tablets, wireless phones, mobile phones, digital music players, memory cards, or any device that can transmit and/or receive information in wireless environments.

The memory system 300 includes a controller 310, an input/output device 320 (such as a keypad, a keyboard and/or a display), a memory 330, an interface 340, and a bus 350. The memory 330 and the interface 340 communicate with each other through the bus 350.

The controller 310 includes a logic device implemented according to any of the exemplary embodiments of the present inventive concept described herein in detail. The logic device may perform a processing operation on logic data. Specifically, the controller 310 may include at least one microprocessor, a digital signal processor, a microcontroller, or other similar processors. The memory 330 may be used to store commands executed by the controller 310. The input/output device 320 may receive data or signals from the outside of the memory system 310, or may output data or signals to the outside of the memory system 310. For example, the input/output device 320 may include a keyboard, a keypad unit, and/or a display device.

The memory 330 includes one or more memory devices according to the exemplary embodiments of the present inventive concept described herein in detail. The memory 330 may further include random-access volatile memories and other various types of memories. The interface 340 functions to transmit data to a communication network or to receive data from the communication network.

According to the exemplary embodiments of the present inventive concept, the self-aligned contact is formed between the gate electrodes. The capping patterns having a greater width than the gate electrodes are formed on the gate electrodes, thereby effectively preventing an electrical short between the metal contact and the gate electrodes. Therefore, the reliability of the semiconductor device is enhanced.

The above-described subject matter is to be considered illustrative and not restrictive, and the appended claims are intended to cover all such modifications, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description.

What is clamed is:

1. A method of forming a semiconductor device, comprising:
    forming gate electrodes on a semiconductor substrate and forming spacers on first and second side surfaces of the gate electrodes;
    forming capping patterns on the gate electrodes; and
    forming a metal contact between the gate electrodes,
    wherein each of the capping patterns is formed to have a width greater than a width of each of the gate electrodes,
    wherein forming the capping patterns comprises:
        forming a first insulating layer disposed between the spacers;
        forming a second insulating layer covering the first insulating layer and the gate electrodes,
        forming first mask patterns having first openings on the second insulating layer, wherein the first mask patterns are formed with a width greater than the width of the gate electrodes,
        forming second mask patterns on the first mask patterns, the second mask patterns having second openings, the second openings being greater in width than the first openings and exposing the first openings, and
        etching the first insulating layer using the first and second mask patterns as a mask to expose an upper surface of the semiconductor substrate, and
    wherein the metal contact is formed to be electrically connected with the semiconductor substrate, and
    wherein, after removing the second mask patterns, forming the metal contact comprises forming a metal layer filling a space between the gate electrodes, and recessing some of the metal layer and the first mask patterns exposing top surfaces of the capping patterns.

2. The method of claim 1, wherein forming gate electrodes and forming spacers comprises:
    forming dummy gate patterns on the semiconductor substrate;

forming the spacers on side surfaces of the dummy gate patterns; and removing the dummy gate patterns to form a third opening, wherein the gate electrodes are formed in the third opening.

3. The method of claim 2, further comprising, prior to forming the gate electrodes, forming a gate insulating layer in the first opening.

4. The method of claim 2, wherein, after the gate electrodes are formed, upper surfaces of the gate electrodes are exposed, and lower surfaces of the capping patterns contact the upper surfaces of the gate electrodes.

5. The method of claim 1, wherein a side surface of the capping pattern is horizontally offset with respect to at least one of the first and second side surfaces of each of the gate electrodes.

6. The method of claim 1, wherein the capping patterns are formed to cover the gate electrodes and at least some of the spacers.

7. The method of claim 1, wherein the width of each of the first mask patterns is greater than or equal to a sum of the width of each of the gate electrodes and widths of the spacers on both side surfaces of each of the gate electrodes.

8. The method of claim,
wherein the first openings are formed in a line shape and the second openings are formed in a hole or bar shape.

9. The method of claim 8, wherein forming the capping patterns further comprises, after forming the first mask patterns, forming a third insulating layer filling the first opening.

10. The method of claim 9, wherein etching the first insulating layer comprises etching the second insulating layer and the third insulating layer.

11. The method of claim 10, further comprising, after etching the first, second and third insulating layers, removing the second mask patterns and forming a subsidiary insulating layer covering the first mask patterns, the capping patterns and the spacers.

12. The method of claim 11, further comprising etching some of the first mask patterns and the subsidiary insulating layer to expose an upper surface of the semiconductor substrate.

13. The method of claim 12, further comprising, prior to forming the second insulating layer, forming an etch stopper layer covering the spacers and the semiconductor substrate.

14. The method of claim 13, wherein exposing the semiconductor substrate comprises etching the etch stopper layer covering the semiconductor substrate to form an etch stopper pattern on the spacers.

15. The method of claim 12, further comprising forming a silicide layer on the exposed semiconductor substrate, wherein the metal contacts are formed on the silicide layer.

16. The method of claim 1, wherein the gate electrode comprises at least one of a metal and a metal compound.

17. The method of claim 1, wherein the capping pattern comprises a silicon oxide layer.

18. The method of claim 1, wherein the gate electrode comprises at least one of aluminum, titanium nitride and tantalum nitride.

19. The method of claim 1, wherein:
the first openings are formed in a line shape and the second openings are formed in a hole or bar shape, and
the second openings comprise an extending opening which exposes the first openings adjacent to each other at the same time.

20. The method of claim 19, wherein forming the capping patterns comprises etching at least some of the first mask pattern exposed by the extending opening to form in a recess pattern.

21. The method of claim 20, wherein forming the metal contacts comprises forming a metal layer filling a space between the gate electrodes and etching some of the metal layer to expose at least one of the first mask patterns.

22. The method of claim 21, wherein the metal contacts are connected to each other on the recess pattern.

23. A method of forming a semiconductor device, comprising:
forming a dummy gate pattern on a semiconductor substrate;
forming a spacer on a sidewall of the dummy gate pattern;
forming an etch stopper layer covering the dummy gate pattern and the spacer;
forming a first insulating layer on the etch stopper layer;
performing a planarizing process for the first insulating layer and the etch stopper layer to expose an upper surface of the dummy gate pattern;
removing the dummy gate pattern;
forming gate electrodes on a region from which the dummy gate pattern is removed;
forming capping patterns on the gate electrodes; and
forming a metal contact between the gate electrodes,
wherein each of the capping patterns is formed with a width which is greater than a width of the gate electrodes,
wherein forming the capping patterns comprises:
forming a second insulating layer covering the first insulating layer and the gate electrodes;
forming first mask patterns having first openings on the second insulating layer, wherein the first mask patterns are formed with a width greater than the width of the gate electrodes,
forming second mask patterns on the first mask patterns, the second mask patterns having second openings, the second openings being greater in width than the first openings and exposing the first openings, and
etching the second insulating layer using the first and second mask patterns as a mask, and
wherein the metal contact is formed to be electrically connected with the semiconductor substrate, and
wherein, after removing the second mask patterns, forming the metal contact comprises forming a metal layer filling a space between the gate electrodes, and recessing some of the metal layer and the first mask patterns exposing top surfaces of the capping patterns.

24. The method of claim 23, further comprising, prior to forming the dummy gate pattern on the semiconductor substrate, forming a sacrificial oxide layer on the semiconductor substrate.

25. The method of claim 24, further comprising, after removing the dummy gate pattern, removing the sacrificial oxide layer such that the semiconductor substrate is exposed.

26. The method of claim 25, further comprising, prior to forming the gate electrode, forming a gate insulating layer on the exposed semiconductor substrate.

27. A method of forming a semiconductor device, comprising:
forming gate electrodes on a semiconductor substrate and forming spacers on first and second side surfaces of the gate electrodes;
forming a first insulating layer disposed between the spacers;
forming a second insulating layer covering the first insulating layer and the gate electrodes;
forming first mask patterns having first openings on the second insulating layer, wherein the first mask patterns are formed with a width greater than the width of the gate electrodes;

forming second mask patterns on the first mask patterns, the second mask patterns having second openings, the second openings being greater in width than the first openings and exposing the first openings;

etching the second insulating layer using the first and second mask patterns as a mask to form capping patterns on the gate electrodes, the capping patterns having a width greater than the width of the gate electrodes;

etching the first insulating layer using the first and second mask patterns as a mask to expose an upper surface of the semiconductor substrate;

after removing the second mask patterns, forming a metal layer filling a space between the gate electrodes; and recessing some of the metal layer and the first mask patterns to expose top surfaces of the capping patterns.

28. The method of claim 27, further comprising forming a silicide layer on the exposed semiconductor substrate, wherein the metal layer is formed on the silicide layer.

* * * * *